(12) United States Patent
Kitano et al.

(10) Patent No.: US 7,807,953 B2
(45) Date of Patent: Oct. 5, 2010

(54) SOLID-STATE IMAGING DEVICE AND IMAGING APPARATUS

(75) Inventors: Yoshiaki Kitano, Kanagawa (JP); Keiji Tatani, Kanagawa (JP); Shinya Watanabe, Kumamoto (JP); Kouji Yahazu, Kanagawa (JP); Yosuke Isoo, Fukuoka (JP); Masaru Suzuki, Tokyo (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 12/458,661

(22) Filed: Jul. 20, 2009

(65) Prior Publication Data

US 2009/0278031 A1 Nov. 12, 2009

Related U.S. Application Data

(62) Division of application No. 11/987,313, filed on Nov. 29, 2007.

(30) Foreign Application Priority Data

Dec. 19, 2006 (JP) .............................. 2006-341120
Feb. 27, 2007 (JP) .............................. 2007-046546

(51) Int. Cl.
 *H01L 27/00* (2006.01)
(52) U.S. Cl. ...................... 250/208.1; 257/434; 257/437
(58) Field of Classification Search ............. 250/208.1, 250/214.1, 214 R; 257/431, 432, 434, 435, 257/437; 348/294
See application file for complete search history.

(56) References Cited

U.S. PATENT DOCUMENTS

2009/0079856 A1* 3/2009 Yahazu ........................ 348/294
2009/0302408 A1* 12/2009 Nakagawa et al. .......... 257/432

FOREIGN PATENT DOCUMENTS

| JP | 10-284709 | 10/1998 |
|----|-----------|---------|
| JP | 2001-035849 | 2/2001 |
| JP | 2005-033110 | 2/2005 |
| JP | 2006-073885 | 3/2006 |
| JP | 2006-156611 | 6/2006 |
| JP | 2006-278539 | 10/2006 |
| JP | 2006-332124 | 12/2006 |
| JP | 2007-243100 | 9/2007 |

OTHER PUBLICATIONS

Japanese Office Action issued Mar. 3, 2009 for corresponding Japanese Application No. 2006-341120.
Japanese Office Action issued Apr. 2, 2009 for corresponding Japanese Application No. 2007-046546.

\* cited by examiner

*Primary Examiner*—Kevin Pyo
(74) *Attorney, Agent, or Firm*—Rader, Fishman & Grauer PLLC

(57) ABSTRACT

There is provided a solid-state imaging device, including: a semiconductor substrate having a plurality of pixels, each having a photoelectric conversion portion, formed therein; and a laminated film formed on said semiconductor substrate; wherein said laminated film includes a hydrogen desorbing film for desorbing hydrogen, and a hydrogen blocking-off film disposed so as to overlie said hydrogen desorbing film.

6 Claims, 16 Drawing Sheets

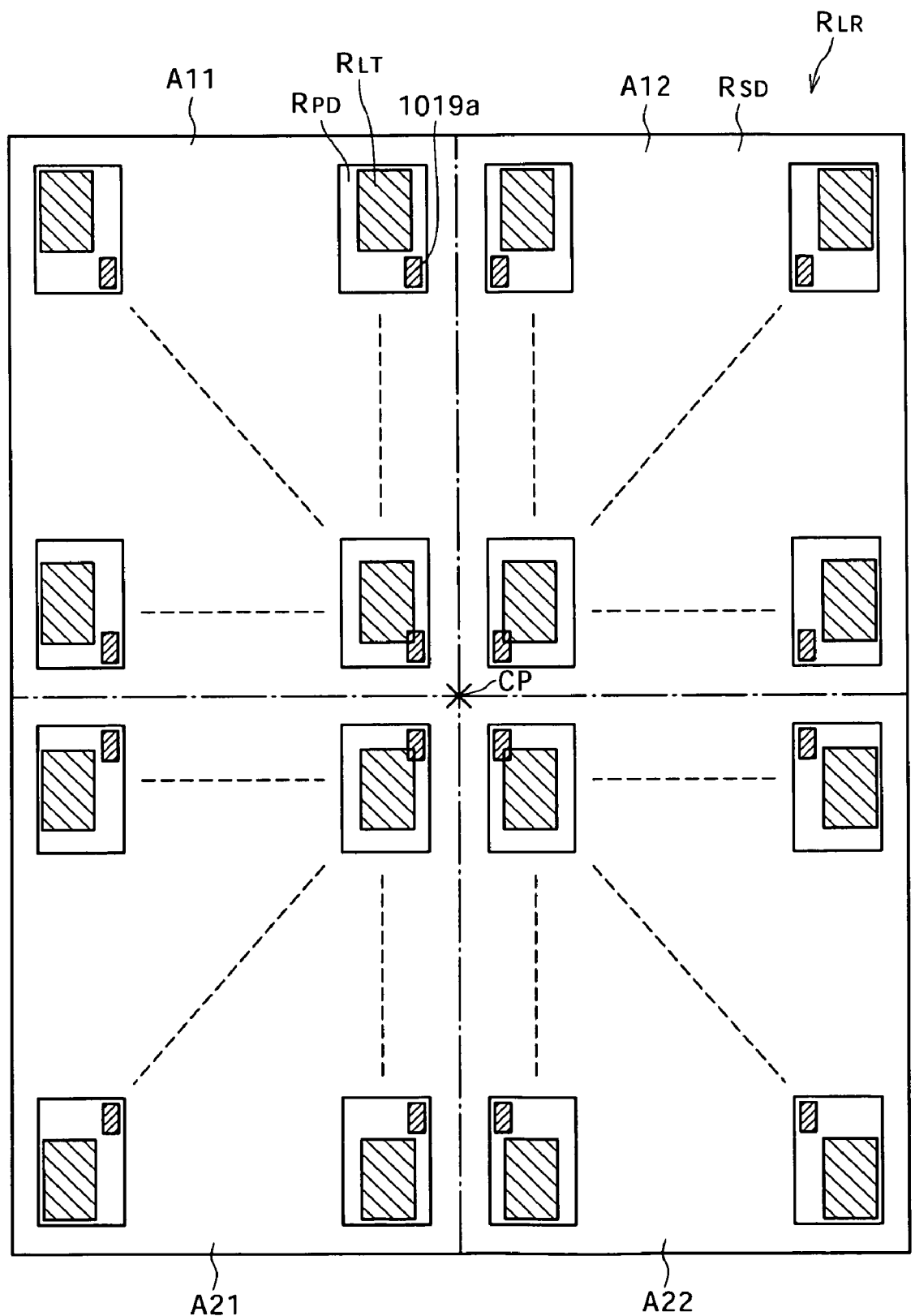

SOLID-STATE IMAGING DEVICE AND IMAGING APPARATUS

CROSS REFERENCE TO RELATED APPLICATION

The Present application is a Divisional Application of the patent application Ser. No. 11/987,313, filed Nov. 29, 2007, which is based on Japanese Priority Documents JP2006-341120, filed in the Japanese Patent Office on Dec. 19, 2006, and JP2007-046546, filed Feb. 27, 2007, the entire contents of which are incorporated herein by reference.

BACKGROUND OF THE INVENTION

1. Field of the Invention

The present invention relates to various solid-state imaging devices such as a charge coupled device (CCD) image sensor and a complementary metal oxide semiconductor (CMOS) image sensor, and more particularly to a solid-state imaging device which is capable of effectively reducing noises contained in an imaging signal, and an imaging apparatus using the same.

Also, the present invention relates to a solid-state imaging device and a camera, and more particularly to a solid-state imaging device in which pixels each having a photodiode in its light receiving surface are arranged in matrix, and an imaging apparatus including the same.

2. Description of the Related Art

In recent years, solid-state imaging devices typified by a CCD image sensor and a CMOS image sensor have been actively developed, and are used in the various camera apparatuses, mobile phones and the like.

For example, in the CCD image sensor, a plurality of pixels each having a photodiode (photoelectric conversion portion) are two-dimensionally disposed on a semiconductor substrate. In addition, a CCD vertical transfer register is provided between each adjacent two pixels. Also, a CCD horizontal transfer register is provided in an output terminal of each of the CCD vertical transfer registers.

In addition, laminated films such as an insulating film, a transfer electrode film, and a light shielding film are formed in order on the semiconductor substrate, and a color filter, a microlens, and the like are formed on the semiconductor substrate through a flattened film or the like.

In such a CCD image sensor, a drive pulse is supplied to the transfer electrode formed on the semiconductor substrate, thereby driving each of the transfer registers. Signal charges generated in the photodiode of the pixel are successively transferred through the CCD vertical transfer register and the CCD horizontal transfer register. Also, the signal charges are then converted either into a voltage signal or into a current signal by the photoelectric conversion portion provided in an output terminal of the CCD horizontal transfer register. Also, the resulting voltage signal or current signal is then outputted in the form of a pixel signal.

On the other hand, in the CMOS image sensor, an imaging region and a peripheral circuit region are provided on the same semiconductor substrate. Here, a plurality of pixels each having a photodiode formed therein are two-dimensionally disposed in the imaging region. Also, the peripheral circuit region is provided outside the imaging region.

In addition, various pixel transistors such as a read transistor (transfer gate), an amplification transistor, a selection transistor, and a reset transistor are provided every pixel in the imaging region. Here, the read transistor reads out the signal charges generated and accumulated in the photodiode to a floating diffusion (FD). The amplification transfer generates the pixel signal corresponding to a potential at the FD. The selection transistor selects the pixel from which the pixel signal is to be outputted. Also, the reset transistor resets the FD. In addition, the signal charges generated and accumulated in each of the photodiodes of the pixels are converted into the pixel signal through the drive for each of the pixel transistors. Also, the resulting pixel signal is outputted through a signal line provided every pixel column.

In addition, a drive control circuit, a signal processing circuit, a power source control circuit, and the like are provided in the peripheral circuit region. Here, the drive control circuit controls an operation for reading out the pixel signal in accordance with the various control pulses supplied to a pixel array portion. The signal processing circuit executes the various signal processing for the pixel signal thus read out. Also, the power source control circuit generates a power source voltage from a driven power source.

In addition, laminated films such as an insulating film, a transfer driving electrode film, a wiring film, and a light shielding film are formed in order on the semiconductor substrate. Also, a color filter, a microlens, and the like are formed on the substrate through a flattened film or the like.

In such a CMOS image sensor, the signal charges accumulated in the photodiode of each of the pixels by driving each of the pixel transistors are converted into the pixel signal every pixel. The resulting pixel signal is outputted every pixel column to be sent to the signal processing circuit in a subsequent stage, and the noise removing processing, the signal processing and the like are executed for the pixel signal in the signal processing circuit. Also, the resulting signal is then outputted from the signal processing circuit.

Now, in the various solid-state imaging devices as has been described above, an area of the photodiode per one pixel is decreased along with the recent multiple pixel promotion. As a result, a quantity of light reaching the photosensitive conversion portion is also reduced, thereby reducing a sensitivity of the photosensitive conversion portion.

For this reason, especially in a low illuminance intensity, an influence of noises exerted on an image quality becomes large, and thus it is necessary to improve an S/N ratio.

Heretofore, it has been known that the noises are suppressed by supplying hydrogen to the photoelectric conversion portion and the transistor region.

FIG. 15 is a cross sectional view showing a pixel structure of a CMOS image sensor according to a related art example.

Firstly, in an upper layer portion of a silicon (Si) substrate 400, a photodiode (PD) 410 and a pixel transistor (Tr) 420 are formed in a region isolated by isolation portions 401. In addition, a lower laminated film 430 including a gate insulating film, a gate electrode film for transistor drive, and the like is disposed on a surface of the silicon substrate 400. Also, a plurality of wiring films 450 are formed on the lower laminated film 430 through various interlayer insulating films 440.

Also, in the related art example shown in FIG. 15, a hydrogen desorbing film 460 containing therein hydrogen is formed above the various interlayer insulating films 440, and a color filter 480 and an on-chip microlens 490 are formed on the hydrogen desorbing film 460 through a protective film 470. This technique, for example, is described in Japanese Patent Laid-Open No. 2002-231915 (Patent Document 1).

In the solid-state imaging device using the CCD element, the CMOS sensor or the like, a light is made incident to the photodiode (photoelectric conversion portion) formed on the surface of the semiconductor substrate. Also, the video signal is obtained from the signal charges generated in the photodiode.

In the CCD element, for example, a plurality of pixels are two-dimensionally arranged in matrix on a light receiving surface, and the photodiode is provided every pixel. Also, the signal charges which are generated and accumulated in each of the photodiodes in a phase of light reception are transferred through a CCD vertical transfer path and a horizontal transfer path to be read out.

In addition, in the CMOS sensor, for example, a plurality of pixels are two-dimensionally arranged in matrix on a light receiving surface similarly to the case of the CCD sensor, and the photodiode is provided every pixel. Also, the signal charges which are generated and accumulated in each of the photodiodes in a phase of light reception are transferred to an impurity diffusion layer called floating diffusion through the drive by a CMOS circuit. Also, the signal charges are then converted into a signal voltage, and the resulting signal voltage is read out.

FIG. 16 is a schematic plan view showing dispositions of photodiodes on a light receiving surface of a solid-state imaging device according to a related art example.

For example, in a photodiode region $R_{PD}$ of a light receiving surface $R_{LR}$, an n-type charge accumulating layer and a $p^+$-type surface layer overlying the n-type charge accumulating layer are formed every pixel in a p-type well region of a semiconductor substrate. Thus, a photodiode having pn junction is structured.

A light shielding film for shielding incidence of a light is formed in a region, as a light shielding region $R_{SD}$, other than the photodiode region $R_{PD}$. For example, in addition to an isolation film for partitioning a light receiving surface into a plurality of regions corresponding to pixels, respectively, a CCD transfer path and the like in the case of a CCD element, and a CMOS circuit and the like in the case of the CMOS sensor are provided in a layer underlying the light shielding film.

In addition, in order to prevent the light made incident to each of the photodiodes from being reflected by a surface of a silicon substrate, an antireflection film is formed so as to cover the photodiodes in the respective photodiode regions $R_{PD}$.

For example, a silicon nitride film or the like which is lower in refractive index than silicon, and is higher in refractive index than a silicon oxide film as an interlayer insulating film formed so as to overlie the antireflection film is used as a material for the antireflection film.

For the purpose of obtaining a maximum light reflection preventing effect in the solid-state imaging device as has been described above, the antireflection film needs to be formed over the entire surface of the photodiode regions $R_{PD}$ each contributing to the photosensitive conversion.

On the other hand, it is known in the art that a dark current as one of important properties of the solid-state imaging device, for example, can be reduced by terminating dangling-bond of silicon through hydrotreating (sintering).

Here, in the case where the antireflection film is formed over the entire surface of the photodiode regions $R_{PD}$ in the manner as described above, the supply of hydrogen to the silicon region for suppression of the dark current is impeded, so that the dark current increases.

In order to cope with the above problem, Japanese Patent No. 3,070,513 (Patent Document 2) discloses a technique in which a removal region is formed in a silicon nitride film in a lower portion of a CCD transfer gate of a CCD element in order to supply hydrogen.

Japanese Patent Laid-Open No. 2004-165236 (Patent Document 3) discloses a technique in which a removal region is formed in a silicon nitride film used as an etching stopper in a CMOS sensor or the like in a light receiving portion in order to reduce the dark current.

Japanese Patent Laid-Open No. 2005-33110 (Patent Document 4) discloses a technique in which a removal region is formed in a silicon nitride film in a photodiode region of a CCD element. Formation of the removal region in the photodiode region promotes processing for terminating the dangling-bond, in the photodiode region, which is thought to greatly contribute to the dark current. As a result, the dark current can be further reduced.

In the case where the removal region in the silicon nitride film is disposed in the photodiode region in the manner as described above, in general, the removal region is disposed in symmetrical shape in the photodiode region. That is to say, the removal regions are formed which have an uniform shape for all the pixels irrespective of positions in the light receiving surface. For example, in the related art example shown in FIG. 16, a pair of stripe-like removal regions $R_H$ is formed in left-hand and right-hand end portions of each of the photodiode regions $R_{PD}$.

SUMMARY OF THE INVENTION

However, the related art described above involves a problem as will be described below. That is to say, an amount of hydrogen supplied to the photodiode and the transistor is reduced all the more because hydrogen diffuses from the hydrogen desorbing region into the region other than the photodiodes and the transistors. As a result, the noises are not effectively removed.

However, as shown in Patent Document 4, the removal region for the silicon nitride film is disposed in the photodiode region, for example, in the case of the layout in which a pair of stripe-like removal regions $R_H$ is formed in the left-hand and right-hand end portions of each of the photodiode regions $R_{PD}$ involves the following problem. That is to say, in the pixel at the central portion of the light receiving surface $R_{LR}$, a light radiation region $R_{LT}$ is located approximately at the central portion of the photodiode region $R_{PD}$. However, in the pixel at the end of the light receiving surface $R_{LR}$, the light radiation region $R_{LT}$ is off from the center of the photodiode region $R_{PD}$ in a direction along with the pixel concerned gets away from the center of the light receiving surface $R_{LR}$. For this reason, a rate at which the light radiation region $R_{LT}$ of the actually condensed light overlaps the removal region $R_H$ is larger at the pixel close to the end of the light receiving surface $R_{LR}$. As a result, there is encountered a problem that the antireflection efficiency becomes lower and thus the sensitivity becomes lower at the pixel closer to the end of the light receiving surface $R_{LR}$.

A problem to be solved is that the antireflection efficiency becomes lower and thus the sensitivity becomes lower at the pixel closer to the end of the light receiving surface in the solid-state imaging device.

In the light of the foregoing, it is therefore desirable to provide a solid-state imaging device which is capable of effectively performing supply of hydrogen therein, and effectively suppressing generation of noises, thereby enhancing an image quality, and an imaging apparatus using the same.

According to an embodiment of the present invention, there is provided a solid-state imaging device, including: a semiconductor substrate having a plurality of pixels, each having a photoelectric conversion portion, formed therein; and a laminated film formed on the semiconductor substrate;

in which the laminated film includes: a hydrogen desorbing film for desorbing hydrogen; and a hydrogen blocking-off film disposed so as to overlie the hydrogen desorbing film.

In addition, according to another embodiment of the present invention, there is provided an imaging apparatus, including: an imaging portion using a solid-state imaging device; a control portion for controlling the imaging portion; and a manipulation portion for manipulating the imaging portion; in which the solid-state imaging device includes: a semiconductor substrate having a plurality of pixels, each having a photoelectric conversion portion, formed therein; and a laminated film formed on the semiconductor substrate; and the laminated film includes: a hydrogen desorbing film for desorbing hydrogen; and a hydrogen blocking-off film disposed so as to overlie the hydrogen desorbing film.

In addition, according to still another embodiment of the present invention, there is provided a solid-state imaging device having a plurality of pixels integrated on a light receiving surface, the solid-state imaging including: a photodiode formed every pixel through partition on a semiconductor substrate becoming the light receiving surface; a signal reading-out portion formed on the semiconductor substrate for reading out either signal charges generated and accumulated in the photodiode or a voltage corresponding to the signal charges; and an antireflection film formed so as to cover regions of the photodiodes; in which a removal portion obtained by partially removing the antireflection film is provided within each of the photodiode regions, and dispositions of the removal regions within the respective photodiode regions are different from one another among the pixels.

According to the still another embodiment of the present invention, in the solid-state imaging device, the plurality of pixels are integrated on the light receiving surface, and the photodiode is formed every pixel through the partition on the semiconductor substrate becoming the light receiving surface. In addition, the signal reading-out portion for reading out either the signal charges generated and accumulated in the photodiode or the voltage corresponding to the signal charges is formed on the semiconductor substrate. Here, the antireflection film is formed so as to cover the photodiode regions. The removal region obtained by partly removing the antireflection film is provided within each of the photodiode regions. Also, the dispositions of the removal regions as described above within the respective photodiode regions are different from one another among the pixels.

According to yet another embodiment of the present invention, there is provided an imaging apparatus, including: a solid-state imaging device having a plurality of pixels integrated on a light receiving surface; an optical system for guiding an incident light to an imaging portion of the solid-state imaging device; and a signal processing circuit for processing an output signal from the solid-state imaging device; in which the solid-state imaging device includes: a photodiode formed every pixel through partition on a semiconductor substrate becoming the light receiving surface; a signal reading-out portion formed on the semiconductor substrate for reading out either signal charges generated and accumulated in the photodiode or a voltage corresponding to the signal charges; and an antireflection film formed so as to cover regions of the photodiodes; and a removal portion obtained by partially removing the antireflection film is provided within each of the photodiode regions, and dispositions of the removal regions within the respective photodiode regions are different from one another among the pixels.

According to the yet another embodiment of the present invention, the imaging apparatus includes the solid-state imaging device having the plurality of pixels integrated on the light receiving surface, the optical system for guiding the incident light to the imaging portion of the solid-state imaging device; and the signal processing circuit for processing the output signal from the solid-state imaging device. Also, the solid-state imaging device has the construction as described above.

According to the embodiment of the present invention, the laminated layer of the solid-state imaging device is provided with the hydrogen desorbing film for desorbing hydrogen, and the hydrogen blocking-off film disposed so as to overlie the hydrogen desorbing film. As a result, the hydrogen desorbed from the hydrogen desorbing film can be efficiently supplied to the photoelectric conversion portion, other transistors, the transfer register, and the like on the semiconductor substrate side without being diffused into any of the unnecessary regions. Thus, the supply of the sufficient amount of hydrogen makes it possible to realize the high noise suppressing effect and to enhance the image quality in the solid-state imaging device.

In addition, according to the another embodiment of the present invention, the laminated film of the solid-state imaging device used in the imaging portion is provided with the hydrogen desorbing film for desorbing hydrogen, and the hydrogen blocking-off film disposed so as to overlie the hydrogen desorbing film. As a result, the hydrogen desorbed from the hydrogen desorbing film can be efficiently supplied to the photoelectric conversion portion, other transistors, the transfer register, and the like on the semiconductor substrate side without being diffused into any of the unnecessary regions. Thus, the supply of the sufficient amount of hydrogen makes it possible to realize the high noise suppressing effect and to enhance the image quality in the imaging portion.

In addition, according to the still another embodiment of the present invention, in the solid-state imaging device, the light receiving surface is partitioned into a plurality of regions. Also, the removal region in the antireflection film is set as being caused to be off, for example, in a direction opposite to a direction along which the light radiation region within corresponding one of the photodiode regions becomes off when viewed from the center of the light receiving surface to the end thereof in each of the regions. As a result, the light radiation region can be prevented from overlapping the removal region over the region from the center of the light receiving surface to the end thereof. Consequently, it is possible to suppress the reduction in sensitivity due to the reduction in antireflection efficiency at the pixel close to the end of the light receiving surface in the solid-state imaging device.

In addition, according to the yet another embodiment of the present invention, in the solid-state imaging device mounted to the imaging apparatus, it is possible to suppress the reduction in sensitivity due to the reduction in antireflection efficiency at the pixel close to the end of the light receiving surface in the solid-state imaging device.

BRIEF DESCRIPTION OF THE DRAWINGS

FIG. 9 is a schematic plan view of the light receiving surface showing a light radiation region when a light is made incident to each of photodiodes of pixels in the solid-state imaging device according to the fourth embodiment of the present invention;

DETAILED DESCRIPTION OF THE PREFERRED EMBODIMENTS

First Embodiment

Figure 1:
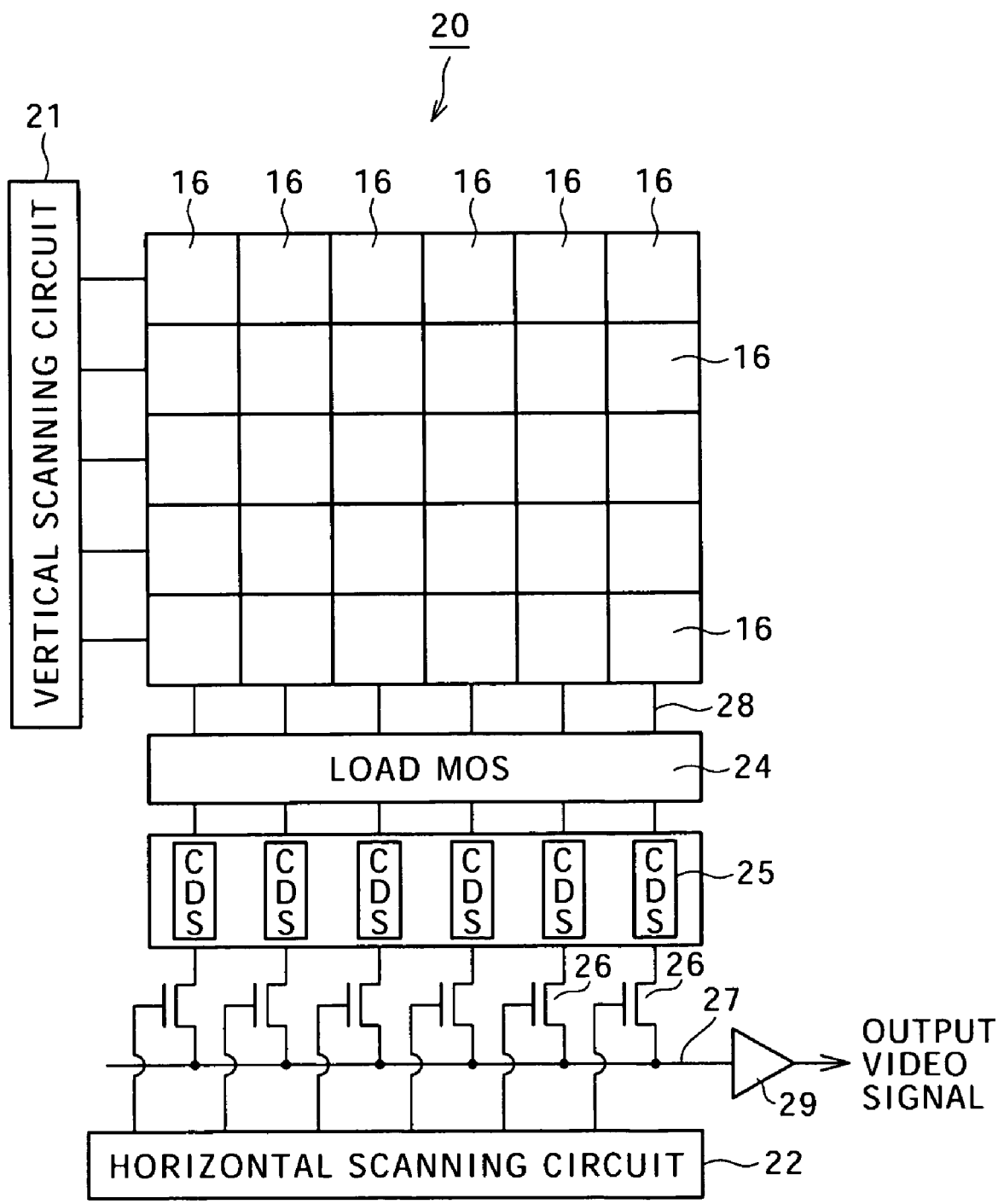
FIG. 1 is a schematic plan view showing a solid-state imaging device according to a first embodiment of the present invention.
Figure 2:
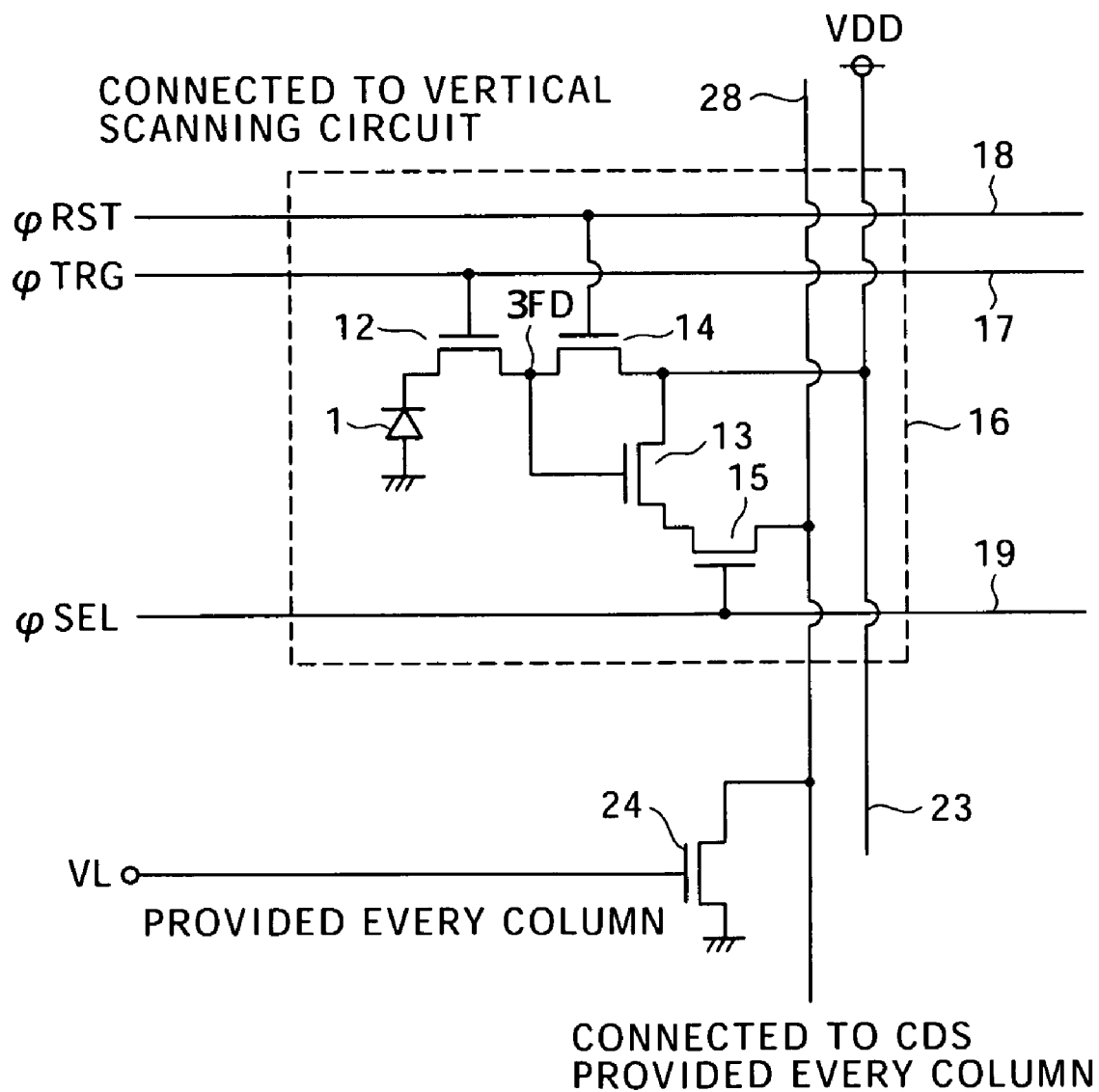
FIG. 2 is a circuit diagram showing a circuit structure in a pixel of the solid-state imaging device shown in FIG. 1.

FIG. 1 is a plan view showing a CMOS image sensor as a solid-state imaging device according to a first embodiment of the present invention. In addition, FIG. 2 is a circuit diagram showing a circuit structure within a pixel of the solid-state imaging device shown in FIG. 1. It is noted although the CMOS image sensor will be mainly described below in this embodiment, the present invention can be similarly applied to a CCD image sensor as well.

As shown in FIG. 1, the solid-state imaging device of the first embodiment includes a pixel array portion 20, a vertical scanning circuit 21, a load MOS transistor circuit 24, CDS circuits 25, horizontal selection transistor circuits 26, and a horizontal scanning circuit 22. Here, in the pixel array portion 20, a plurality of pixels 16 two-dimensionally disposed constitute an imaging region. The vertical scanning circuit 21 controls an operation for successively reading out pixel signals from respective pixels by successively scanning the pixels of the pixel array portion 20 in a vertical direction. The load MOS transistor circuit 24 successively controls vertical signal lines 28 derived from respective pixel columns of the pixel array portion 20. The CDS circuits 25 fetch in the pixel signals read out from the respective pixel columns of the pixel array portion 20, and perform noise removal by executing correlation double sampling processing. The horizontal selection transistor circuits 26 output the pixel signals outputted from the CDS circuits 25, respectively, to a horizontal signal line 27. Also, the horizontal scanning circuit 22 successively selects the horizontal selection transistor circuits 26 in the horizontal direction, and controls an operation for outputting the pixel signals.

In addition, the image signals outputted to the horizontal signal line 27 are transmitted to a circuit in a subsequent stage through a buffer amplifier.

In addition, as shown in FIG. 2, each of the pixels 16 includes a photodiode (PD) 1, a transfer gate transistor (TG) 12, a reset transistor (RST) 14, an amplification transistor (AMP) 13, and a selection transistor 15. Here, the photodiode 1 subjects a light made incident thereto to photoelectric conversion. The transfer gate transistor 12 transfers an electrical signal obtained through the photoelectric conversion to a floating diffusion (FD) portion 3 in accordance with a transfer gate pulse ($\Phi$TRG). The reset transistor 14 resets a potential of the FD portion 3 to a power source voltage VDD in accordance with a reset pulse ($\Phi$RST). The amplification transistor (AMP) 13 converts a change in potential of the FD portion 3 either into a voltage signal or into a current signal. Also, the selection transistor 15 connects an output from the amplification transistor 13 to the vertical signal line 28 in accordance with a selection signal ($\Phi$SEL).

Therefore, the vertical signal line 28, the power source line and the like are wired in the vertical direction in the vicinity of the pixel 16. Also, a read line 17, a reset line 18, a selection line 19 and the like are wired in the horizontal direction in the vicinity of the pixel 16.

Figure 3:
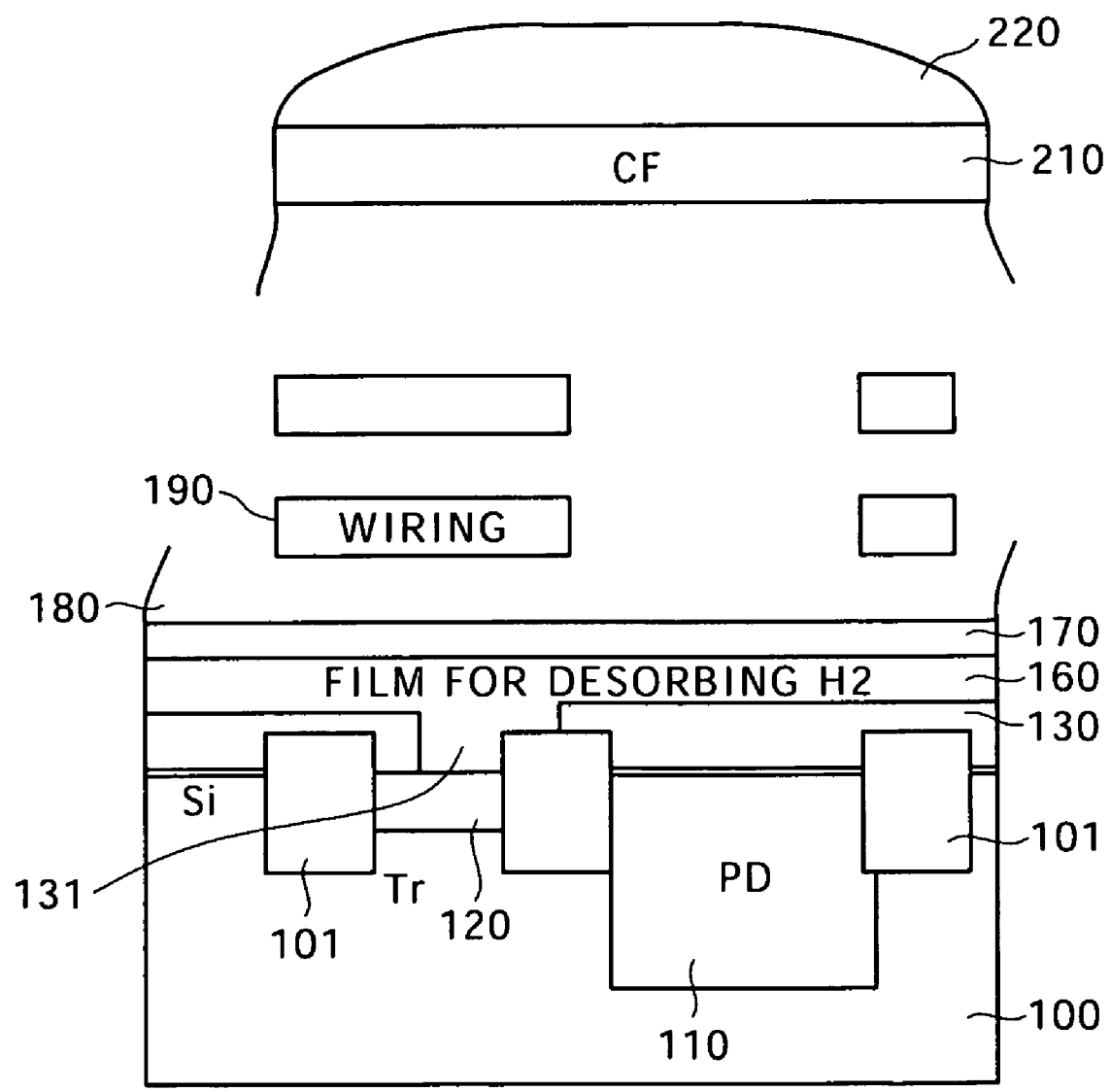
FIG. 3 is a schematic cross sectional view showing a pixel structure in a CMOS image sensor as the solid-state imaging device according to the first embodiment of the present invention.

FIG. 3 is a cross sectional view showing a pixel structure of the CMOS image sensor according to the first embodiment of the present invention.

In the figure, reference numeral 110 designates a photodiode; reference numeral 120 designates a pixel transistor; reference numeral 131 designates an opening portion; reference numeral 160 designates a hydrogen desorbing film; reference numeral 180 designates an interlayer insulating film; reference numeral 190 designates a wiring film; reference numeral 210, a color filter; and 220, an on-chip microlens.

Firstly, the photodiode (PD) 110, the pixel transistor (Tr) 120, and the like are formed in a region defined through isolation by an isolation portion 101 in an upper layer portion of a silicon (Si) substrate 100. It is noted that the pixel transistor 120 includes the transistors such as the transfer gate transistor, amplification transistor and reset transistor described above.

In addition, a lower laminated film 130 including a gate insulating film, a gate electrode film for transistor drive, and other functional films (such as a CoBlock film) is disposed on the surface of the silicon substrate 100.

Also, in the first embodiment, a hydrogen desorbing film 160 for supplying hydrogen to the photodiode 110 and the pixel transistor 120 is formed on the lower laminated film 130. A hydrogen blocking-off film 170 for preventing diffusion of hydrogen is formed on the hydrogen desorbing film 160.

The hydrogen desorbing film 160 is a film which contains therein hydrogen and stably desorbs hydrogen.

In addition, the hydrogen blocking-off film 170 serves to prevent hydrogen desorbed from the hydrogen desorbing film 160 from diffusing upward, thereby guiding hydrogen to the silicon substrate 100.

It is noted that in the first embodiment, the hydrogen desorbing film 160, for example, is made of UV—SiN, and the hydrogen blocking-off film 170, for example, is made of P—SiN. However, it is to be understood that any other suitable materials may be used in the hydrogen desorbing film 160 and the hydrogen blocking-off film 170, respectively, as long as they have the same functions as those of the UV—SiN film and the P—SiN film, respectively.

It is noted that as case may be, a fine opening portion (not shown) may be formed in the film, having a poor permeation property for hydrogen, of the films which are formed below the hydrogen desorbing film 160 band on the surface of the silicon substrate 100 when necessary in order to assist the supply of hydrogen to the inside of the silicon substrate 100.

In addition, a plurality of wiring films 190 are formed on the hydrogen blocking-off film 170 through various interlayer insulating films 180, and a color filter 210 and an on-chip microlens 220 are formed in this order on the plurality of wiring films 190.

With such a structure, the disposition of the hydrogen desorbing film 160 in the vicinity of the upper surface of the silicon substrate 100 results in that a sufficient amount of hydrogen can be supplied to the photodiode 110 and the pixel transistor 120 which are formed below the hydrogen desorbing film 160, and thus the noises can be effectively suppressed. In addition, disposing the hydrogen blocking-off film 170 right above the hydrogen desorbing film 160 results in that it is possible to block off the diffusion of hydrogen desorbed from the hydrogen desorbing film 160 in the upper layer direction, and thus it is possible to improve the efficiency of supplying hydrogen to the photodiode 110 and the pixel transistor 120.

FIGS. 4A to 4E are respectively cross sectional views showing processes for manufacturing the CMOS image sensor of the first embodiment shown in FIG. 3.

Figure 4A:
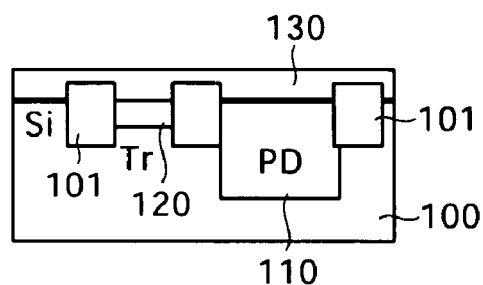
FIGS. 4A to 4E are respectively schematic cross sectional views showing processes for manufacturing the CMOS image sensor shown in FIG. 3.

Firstly, as shown in FIG. 4A, the isolation region 101, the photodiode 110, the pixel transistor 120 and the like are formed on the silicon substrate 100. Also, the lower laminated film 130 including the gate insulating film, the gate electrode film, and other functional films is formed on the surface of the silicon substrate 100.

Figure 4B:
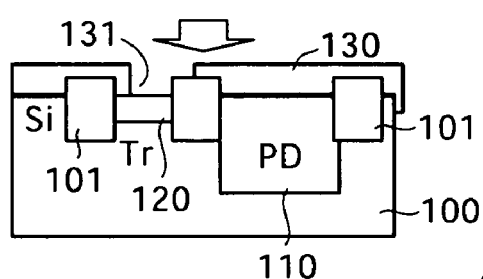

Next, as shown in FIG. 4B, the lower laminated film 130 is patterned by utilizing a suitable etching method after completion of a photolithography process so as to have a predetermined pattern having the opening portion 131. In this case, the fine opening portion allowing hydrogen to be readily supplied to the silicon substrate 100 side is formed separately from the necessary pattern. Of course, the fine opening portion is formed in shape which is not an obstacle to the functions of the films.

Figure 4C:
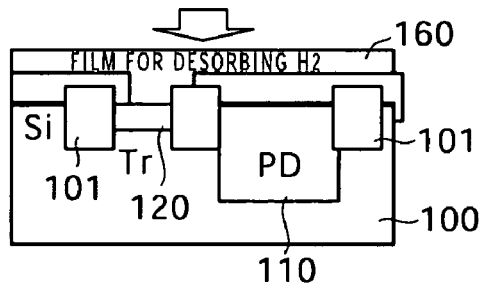
Figure 4D:
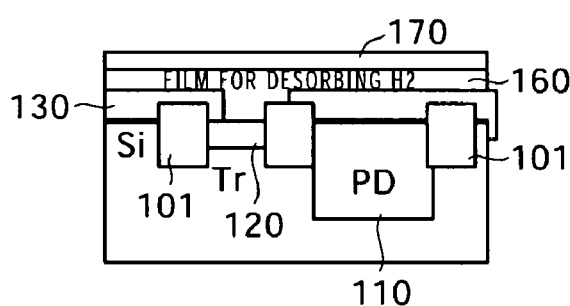

Next, as shown in FIG. 4C, the hydrogen desorbing film 160 is formed on the lower laminated film 130 having the opening portion 131 formed therein. Also, as shown in FIG. 4D, the hydrogen blocking-off film 170 is formed on the hydrogen desorbing film 160.

Figure 4E:
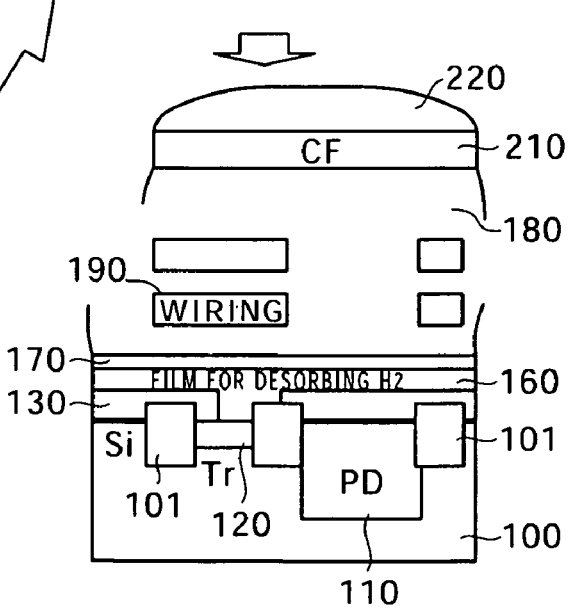

After that, the upper layer films are formed in order similarly to the prior art process, thereby obtaining the structure of the solid-state imaging device as shown in FIG. 4E.

In the solid-state imaging device of this embodiment as described above, the hydrogen desorbing film 160 and the hydrogen blocking-off film 170 are disposed within the laminated film laminated on the silicon substrate 100. As a result, a sufficient amount of hydrogen can be supplied to the photodiode and the transistor (including the transistors other than those in the pixel region). Thus, it is possible to contribute to the suppression of the noises.

In addition, when the film through which hydrogen hardly permeates exists in the lower layer (on the silicon substrate side) of the hydrogen desorbing film 160, the opening portion is suitably formed in that film. As a result, a sufficient amount of hydrogen can be effectively supplied to the photodiode and the transistor. Thus, it is possible to obtain the higher noise suppressing effect.

Next, other embodiments of the present invention will now be described.

Second Embodiment

Figure 5:
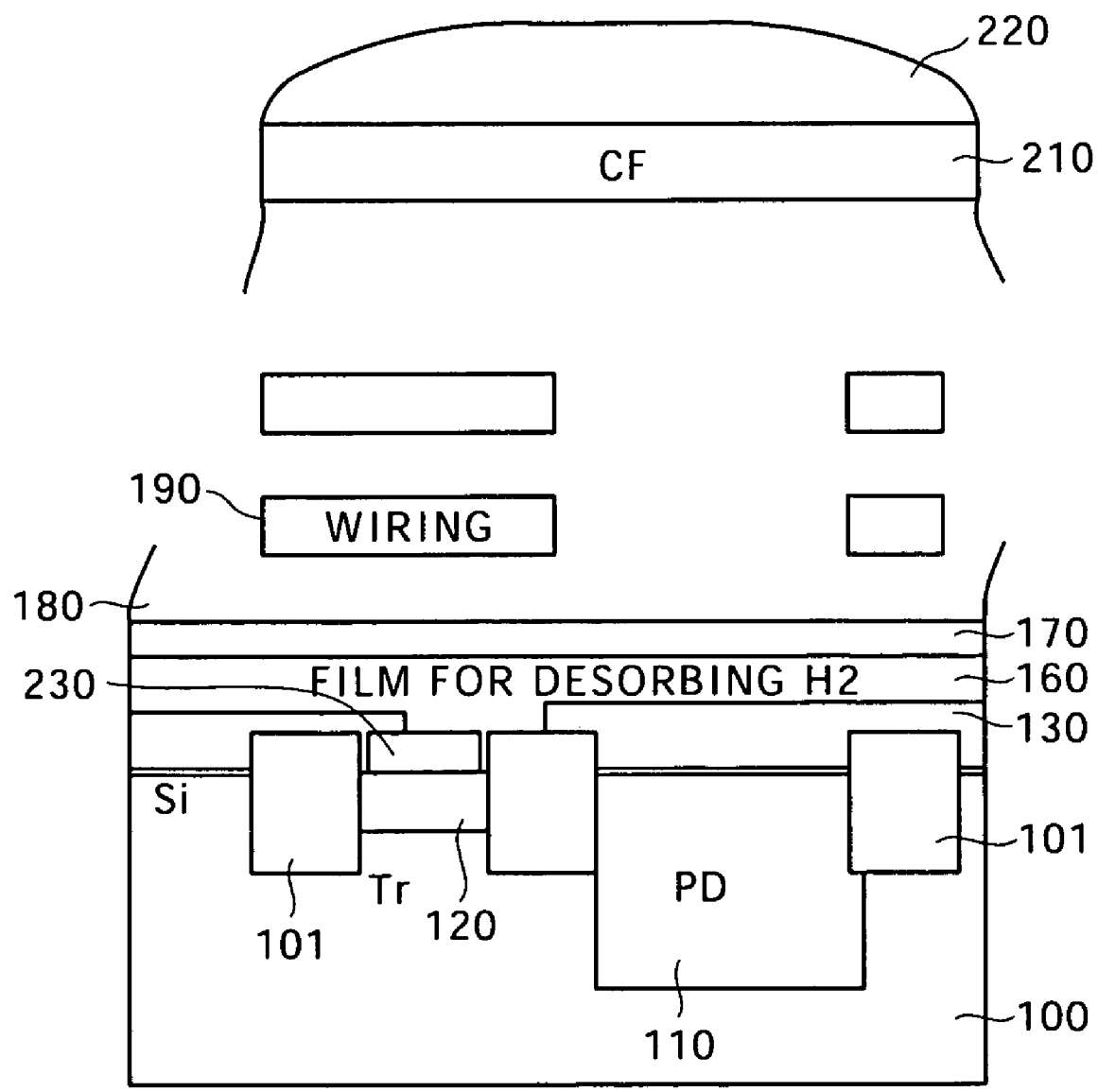
FIG. 5 is a schematic cross sectional view showing a pixel structure of a CMOS image sensor according to a second embodiment of the present invention.

FIG. 5 is a cross sectional view showing a pixel structure of a CMOS image sensor according to a second embodiment of the present invention. It is noted that in FIG. 5, portions corresponding to those described with reference to FIG. 3 are designated with the same reference numerals, respectively.

In the first embodiment shown in FIG. 3, the hydrogen desorbing film 160 is formed on the lower laminated film 130 having the opening portion 131 formed therein, so that the hydrogen desorbing film 160 directly contacts the silicon substrate 100. However, in the second embodiment shown in FIG. 5, a hydrogen permeable film 230 is formed between the hydrogen desorbing film 160 and the silicon substrate 100.

Referring now to FIG. 5, firstly, the photodiode (PD) 101, the pixel transistor (Tr) 120, and the like are formed in the region defined through the isolation by the isolation portion 101 in the upper layer portion of the silicon (Si) substrate 100.

In addition, the lower laminated film 130 including the gate insulating film, the gate electrode film for transistor drive, other functional films, and the like is disposed on the surface of the silicon substrate 100.

Also, the opening portion 131 corresponding to the pattern of the lower laminated film 130, and the opening portion for assisting the supply of hydrogen to the silicon substrate 100 are formed in the lower laminated film 130. Moreover, the hydrogen permeable film 230 is formed in a lower layer region, on the pixel transistor 120, corresponding to the opening portion. The hydrogen permeable film 230, for example, is made of $SiO_2$. Also, the lower laminated film 130 is formed on the surface of the silicon substrate 100 having the hydrogen permeable film 230 formed thereon. Also, the hydrogen desorbing film 160 and the hydrogen blocking-off film 170 are formed on the lower laminated film 130.

Formation of such a hydrogen permeable film 230 results in that it is possible to avoid the direct contact of the hydrogen desorbing film 160 with the surface of the silicon substrate 100, and it is possible to suppress generation of the interface state, thereby making it possible to stabilize the signal characteristics.

It is noted that since other respects in this embodiment are the same as those in the first embodiment shown in FIG. 3, their descriptions are omitted here for the sake of simplicity.

Although the concrete embodiments of the solid-state imaging device according to the present invention have been described so far, the various changes thereof can be further made without departing from the gist of the present invention. For example, although each of the above embodiments have been described so far by giving the CMOS image sensor as the example, the present invention is not intended to be limited to the CMOS image sensor, and, for example, can be applied to any other suitable solid-state imaging device such as the CCD image sensor.

For example, in the CCD image sensor, the hydrogen desorbing film and the hydrogen blocking-off film are formed on the transfer electrode film and the light shielding film on the silicon substrate. As a result, hydrogen can be effectively supplied to the photodiode and the transfer register portion based on the operations of the hydrogen desorbing film and the hydrogen blocking-off film, thereby making it possible to suppress the noises.

In addition, with regard to the structure of the pixel array portion, the present invention is not necessarily limited to the area sensor type solid-state imaging device having the two-dimensional disposition, and thus can be applied to a linear sensor type solid-state imaging device as well having a one-dimensional disposition.

In addition, the positions within the laminated film in which the hydrogen desorbing film and the hydrogen blocking-off film are respectively formed can also be suitably changed. Thus, it is possible to flexibly cope with the lamination structure of the solid-state imaging device to which the present invention is applied.

In addition, the formation of the hydrogen permeable film between the hydrogen desorbing film and the hydrogen blocking-off film makes it possible to obtain the structure in which the hydrogen desorbing film and the hydrogen blocking-off film do not directly contact each other, and to obtain the structure in which the characteristics are stabilized.

In addition, although the hydrogen desorbing film and the hydrogen blocking-off film can be formed over the entire surface of the semiconductor chip, they may also be formed in a partial region for which the supply of hydrogen is especially desired to be controlled.

Also, the solid-state imaging device is not limited to one in which the image sensor or the like is structured on one chip, and thus may be a module in which an imaging portion, a signal processing portion, and an optical system are collectively packaged. Also, the solid-state imaging device may also be one which is utilized in a camera system or a mobile phone. Note that, in the present invention, it is assumed that the structure which has the function of the CMOS image sensor in the form of a simple body is referred to as "the solid-state imaging device", while the structure in which the solid-state imaging device, and other constructional elements (such as a control circuit, a manipulation portion, a display portion, a data accumulating function, and a communication function) are integrated with each other is referred to as "the imaging apparatus".

Third Embodiment

Hereinafter, a concrete example of the imaging apparatus to which the present invention is applied will be described.

Figure 6:
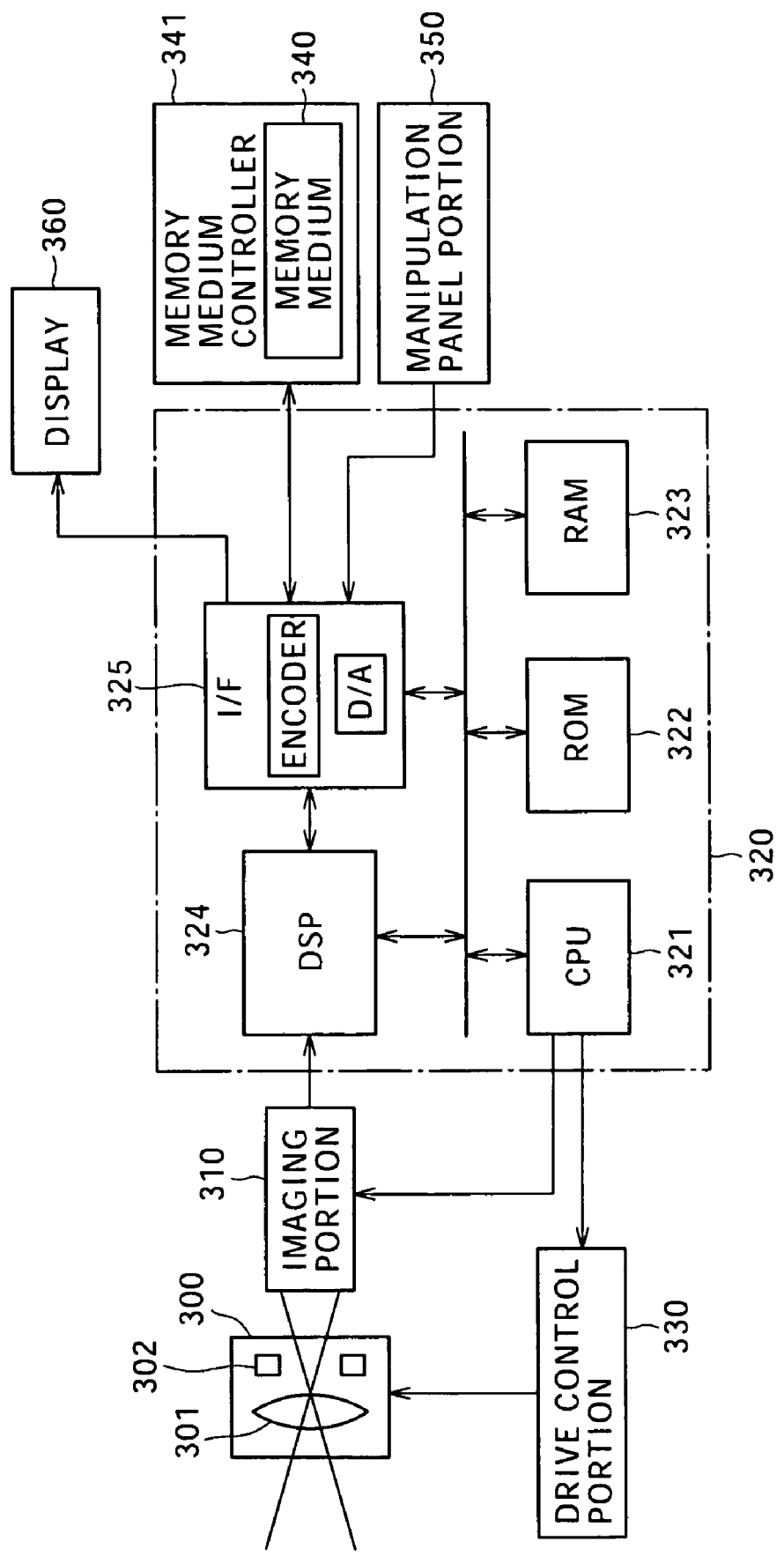
FIG. 6 is a block diagram showing a camera apparatus according to a third embodiment of the present invention.

FIG. 6 is a block diagram showing an example of a configuration of a camera apparatus, using the CMOS image sensor, according to a third embodiment of the present invention.

Referring now to FIG. 6, an imaging portion 310, for example, captures an image of a subject by using the CMOS image sensor shown in FIG. 1, and outputs an imaging signal to a system control portion 320 mounted to a main board.

That is to say, the imaging portion 310 executes processing such as automatic gain control (AGC), optical black (OB) clamp, correlation double sampling (CDS), and A/D conversion for an output signal sent from the CMOS image sensor described above, and generates a digital imaging signal to output the resulting digital imaging signal.

Note that, the third embodiment shows an example in which the imaging portion 310 converts the imaging signal into the digital signal, and outputs the resulting digital signal to the system control portion 320. Alternatively, a configuration may also be adopted such that the imaging portion 310 sends an analog imaging signal to the system control portion 320, and the system control portion 320 side converts the analog imaging signal sent thereto into a digital imaging signal.

In addition, it is to be understood that the various methods have been proposed up to this time for the concrete control operation, signal processing and the like within the imaging portion 310, and thus the concrete control operation, signal processing and the like are not especially limited within the imaging apparatus according to the third embodiment of the present invention.

In addition, the imaging optical system 300 includes a zoom lens 301, a diaphragm mechanism 302 and the like which are disposed within a lens barrel. The imaging optical system 300 serves to image a subject image on the light receiving portion of the CMOS image sensor. Thus, the imaging optical system 300 mechanically drives the portions in accordance with control made by a drive control portion 330 based on an instruction issued from the system control portion 320, thereby controlling automatic focus and the like.

In addition, the system control portion 320 is provided with a CPU 321, a ROM 322, a RAM 323, a DSP 324, an external interface 325, and the like.

The CPU 321 issues instructions to the respective portions of this camera apparatus by using the ROM 322 and the RAM 323, thereby controlling the entire system.

The DSP 324 generates video signal (such as a YUV signal), about a still image or a moving image, having a predetermined format by executing various signal processing for the imaging signal sent from the imaging portion 310.

The external interface 325 is provided with various encoders and D/A converters. Thus, various control signals and data are transmitted between the system control portion 320, and the external elements (a memory medium 340, a manipulation panel portion 350, and a display device 360 in this embodiment) connected to the system control portion 320 through the external interface 325.

The display device 360 is small one, such as a liquid crystal panel, incorporated in this camera apparatus, and displays thereon a captured image of a subject. It is noted that in addition to the configuration having the small display device incorporated in such a camera apparatus, a configuration may be, of course, adopted such that image data can be transmitted to an external large display device and an image on the image data can be displayed on the external large display device.

The memory medium 340, for example, constituted by any one of various memory cards can suitably reserve therein data on an image. Also, the memory medium 340, for example, is exchangeable for a medium controller 341. In addition to any of the various memory cards, a disc medium using a magnetism or a light, or the like can be used as the memory medium 340.

The manipulation panel portion 350 is provided with input keys with which a user makes various instructions when performing a photographing work by using this camera apparatus. The CPU 321 monitors an input signal from the manipulation panel portion 350, and carries out the control for the various operations in accordance with the contents of the input signal.

The application of the present invention to such a camera apparatus results in that the enhancement of the image quality, the miniaturization of the apparatus, and the like can be realized, and thus the imaging apparatus of high grade can be provided. It is noted that with the configuration described above, how to combine the unit devices or unit modules becoming the constituent elements of the system, the scale of the set, and the like can be suitably selected based on the actual condition or the like of the commercialization of product, and thus the imaging apparatus according to this embodiment of the present invention widely contains the various changes.

In addition, with the solid-state imaging device and the imaging apparatus according to the embodiments of the present invention, the imaging object (subject) is not limited to the general image of a person, a landscape or the like. Thus, the solid-state imaging device and the imaging apparatus according to the embodiments of the present invention can also be applied to a counterfeit money detector, a fingerprint detector or the like for capturing the special fine image pattern.

The apparatus in this case does not includes the general camera apparatus shown in FIG. 5, but further includes a special imaging optical system and a signal processing system for performing a pattern analysis in terms of a configuration. In this case as well, the operation and effect of the present invention are sufficiently played, and thus the precise image detection can be realized.

Moreover, when a remote system for use in remote medical care, surveillance, person authentication or the like is configured, the apparatus including a communication module connected to a network can also be configured as described above. Thus, the wide applications can be realized.

Hereinafter, a solid-state imaging device and a camera including the solid-state imaging device according to embodiments of the present invention will be described with reference to FIGS. 7 to 14.

Fourth Embodiment

Figure 7:
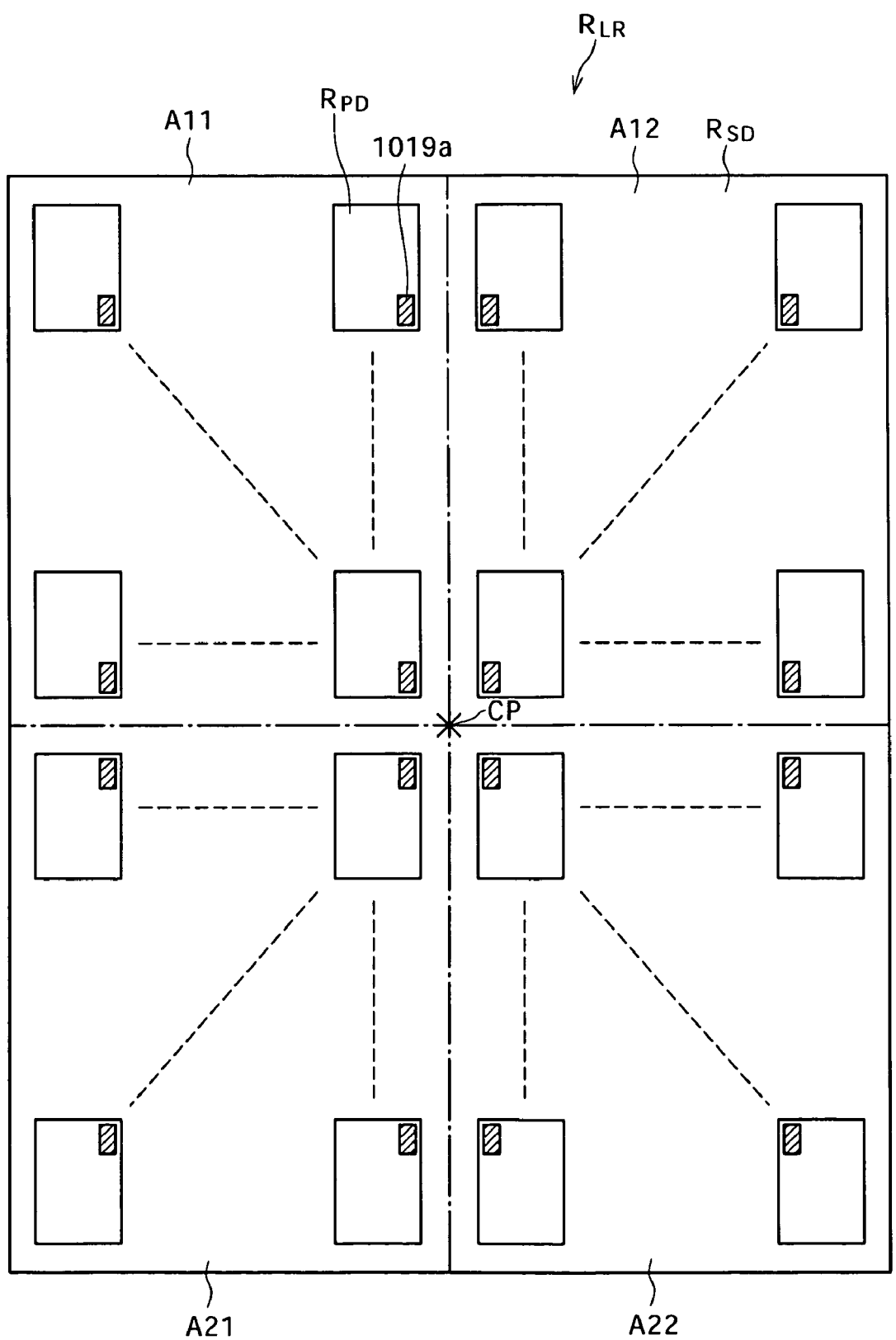
FIG. 7 is a schematic plan view of a light receiving surface of a solid-state imaging device according to a fourth embodiment of the present invention.

FIG. 7 is a schematic plan view of a light receiving surface of a CCD imaging device, as a solid-state imaging device, having a plurality of pixels integrated therein according to a fourth embodiment of the present invention.

In the figure, reference symbol $R_{LR}$ designates a light receiving surface, reference symbol $R_{PD}$ designates a photodiode region, reference symbol $R_{SD}$ designates a light shielding region, and reference symbol CP designates a center of the light receiving surface $R_{LR}$.

For example, in the photodiode region $R_{PD}$ of the light receiving surface $R_{LR}$, an n-type charge accumulating layer and a p$^+$-type surface layer overlying the n-type charge accumulating layer are formed every pixel in a p-type well region of a semiconductor substrate. Thus, a photodiode having pn junction is structured.

A light shielding film for shielding incidence of a light is formed in a region, as the light shielding region $R_{SD}$, other than the photodiode regions $R_{PD}$. For example, in addition to an isolation film for partitioning the light receiving surface $R_{LR}$ into a plurality of regions corresponding to pixels, respectively, a CCD transfer path and the like in the case of a CCD element, and a CMOS circuit and the like in the case of the CMOS sensor are provided in a layer underlying the light shielding film.

In addition, in order to prevent the light made incident to each of the photodiodes from being reflected by a surface of the silicon substrate, an antireflection film is formed so as to cover the photodiodes in the respective photodiode regions $R_{PD}$ and so as to cover the entire surface in the light shielding region $R_{RD}$. In this case, for example, a silicon nitride film or the like which is lower in refractive index than silicon, and is higher in refractive index than a silicon oxide film as an interlayer insulating film formed so as to overlie the antireflection film is used as a material for the antireflection film.

The antireflection film is provided with removal regions 1019a each serving as a supply path for hydrogen in the hydrotreating (sintering) for reduction of the dark current.

In the fourth embodiment, the dispositions of the removal regions 1019a within the respective photodiode regions $R_{PD}$ are different from one another among the pixels. For example, the light receiving surface $R_{LR}$ is partitioned into a plurality of regions (four regions A11, A12, A21 and A22 on the figure). In this case, the positions of the removal regions 1019a within the respective photodiode regions $R_{PD}$ are different from one another among the plurality of regions (the four regions A11, A12, A21 and A22).

More specifically, the positions of the removal regions within the respective photodiode regions $R_{PD}$ are set as ones, close to the center CP of the light receiving surface $R_{LR}$, in the respective photodiode regions $R_{PD}$. Specifically, in the photodiode within the region A11 as a top left-hand portion when viewed from the center CP of the light receiving surface $R_{LR}$ on the figure, the removal region 1019a is formed in a bottom right-hand portion as a position, close to center CP of the light receiving surface $R_{LR}$, within the photodiode region $R_{PD}$.

Likewise, in the photodiode within the region A12 as a top right-hand portion when viewed from the center CP of the light receiving surface $R_{LR}$ on the figure, the removal region 1019a is formed in a bottom right-hand portion as a position, close to the center CP of the light receiving surface $R_{LR}$, within the photodiode region $R_{PD}$. In the photodiode within the region A21 as a bottom left-hand portion when viewed from the center CP of the light receiving surface $R_{LR}$ on the figure, the removal region 1019a is formed in a top right-hand portion as a position, close to the center CP of the light receiving surface $R_{LR}$, within the photodiode region $R_{PD}$. Also, in the photodiode within the region A22 as a bottom right-hand portion when viewed from the center CP of the light receiving surface $R_{LR}$ on the figure, the removal region 1019a is formed in a top left-hand portion as a position, close to the center CP of the light receiving surface $R_{LR}$, within the photodiode region $R_{PD}$.

Figure 8:
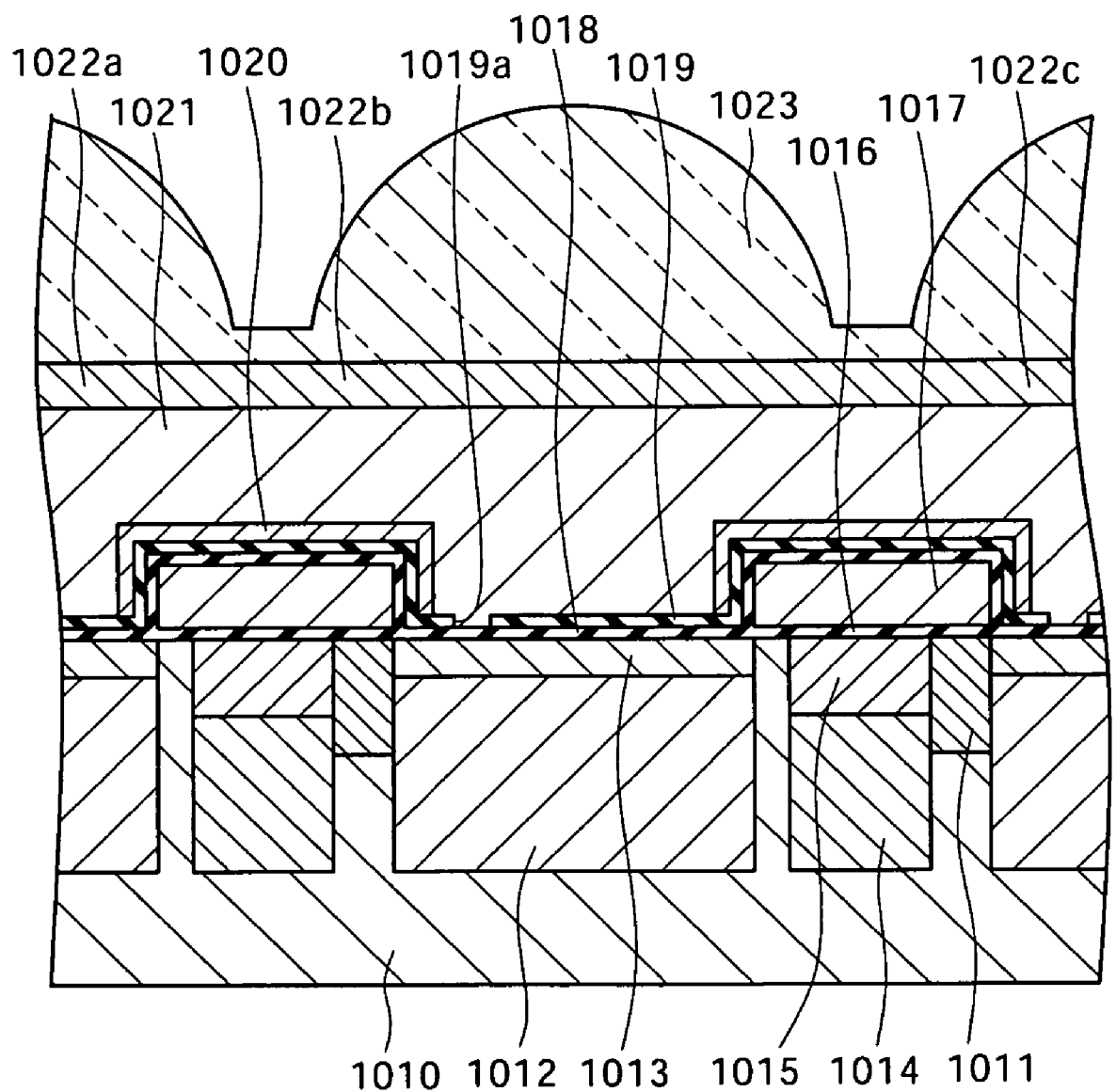
FIG. 8 is a schematic cross sectional view of the solid-state imaging device according to the fourth embodiment of the present invention.

FIG. 8 is a schematic cross sectional view of a CCD element of the solid-state imaging device according to the fourth embodiment of the present invention.

In the figure, reference numeral 1010 designates a p-type well region; reference numeral 1011 designates a p$^+$-type isolation region; reference numeral 1012 designates an n-type charge accumulating layer; reference numeral 1013 designates a p$^+$-type surface layer; reference numeral 1014 designates a p-type semiconductor region; reference numeral 1015 designates an n-type semiconductor region; reference numeral 1016 designates a gate insulating film; reference numeral 1017 designates a transfer gate electrode; reference numeral 1018 designates a surface protective film; reference numeral 1019 designates an antireflection film; reference numerals 1019a, 1019a1, and 1019a2 respectively designate removal regions; reference numeral 1020 designates a light shielding film; reference numeral 1021, a flattened insulating film; reference numerals 1022a, 1022b and 1022c, color filters; and 1023, a microlens.

For example, the p$^+$-type isolation regions 1011 for isolating the pixels from one another through the partition are formed in the p-type well region 1010 of the semiconductor substrate. Also, the n-type charge accumulating layer 1012, and the p$^+$-type surface layer 1013 overlying the n-type charge accumulating layer 1012 are formed in each of the pixel regions, thereby structuring the photodiode having the pn junction.

In addition, for example, in a region adjacent to the photodiode described above, the p-type semiconductor region 1014 and the n-type semiconductor region 1015 form a CCD vertical transfer path in the p-type well region 1010 of the semiconductor substrate.

For example, in the region of the CCD vertical transfer path, the transfer gate electrode 1017 made of polysilicon or the like is formed on the semiconductor substrate through the gate insulating film 1016 made of a silicon oxide or the like. By applying a predetermined clock voltage to the transfer gate electrode 1017, a desired potential is generated in the CCD vertical transfer path, and the signal charges generated in the photodiode are transferred to the charge accumulating layer 1012 as a CCD vertical portion. Also, the vertical transfer can be carried out within a CCD vertical transfer portion.

In addition, for example, the surface protective film 1018 made of a silicon oxide is formed over the entire surface of the photodiode regions $R_{PD}$ and the CCD vertical transfer path, and the antireflection film 1019 made of a silicon nitride is formed on the surface protective film 1018.

Here, the antireflection film 1019 has a function of reducing reflection of a light in each of the photodiode regions $R_{PD}$ based on its refractive index, thickness and the like. Or, the surface protective film 1018 made of a silicon oxide and formed so as to underlie the antireflection film 1019 is also a film capable of contributing to the antireflection function.

In this embodiment, for example, the removal region 1019a is formed in the antireflection film 1019 in each of the photodiode regions $R_{PD}$. Also, the dispositions of the removal regions 1019a within the respective photodiode regions $R_{PD}$ are different from one another among the pixels in the manner as described above.

Moreover, for example, as described above, the light receiving surface $R_{LR}$ is partitioned into a plurality of regions. Thus, the positions of the removal regions 1019a within the respective photodiode regions $R_{PD}$ are different from one another among the regions obtained through the partition. Also, the positions of the removal regions 1019a are set as ones, close to the center CP of the light receiving surface $R_{LR}$, in the respective photodiode regions $R_{PD}$.

In addition, for example, the light shielding film 1020 made of a metal is formed on the antireflection film 1019 so as to cover the region of the transfer gate electrode 1017 except for the photodiode region $R_{PD}$.

Also, for example, the flattened insulating film 1021, made of a silicon oxide or the like, having a flattened surface is formed so as to cover the entire surface of the light shielding film 1020 and the photodiode regions $R_{PD}$. Also, the color filters 1022a, 1022b and 1022c having the three primary colors of red (R), green (G) and blue (B) are formed partitively every pixel on the flattened insulating film 1021.

Moreover, for example, the microlens 1023 is formed every pixel on the color filters 1022a, 1022b and 1022c.

FIG. 9 is a schematic plan view of the light receiving surface showing a light radiation region $R_{LT}$ when a light is made incident to each of the photodiodes in the respective pixels in the solid-state imaging device according to the fourth embodiment of the present invention.

In the figure, reference symbol $R_{LR}$ designates the light receiving surface, reference symbol $R_{PD}$ designates the photodiode region, reference symbol $R_{SD}$ designates the light shielding region, reference symbol $R_{LT}$ designates the light radiation region, reference numeral $R_{TR}$ designates the transfer path region, and reference symbol CP designates the center of the light receiving surface $R_{LR}$.

As shown in FIG. 9, in each of the pixels at the center of the light receiving surface $R_{LR}$, the light radiation region $R_{LT}$ is located approximately at the central portion of the photodiode region $R_{PD}$. On the other hand, in each of the pixels at the ends of the light receiving surface $R_{LR}$, the light radiation region $R_{LT}$ is off from the center CP of the photodiode region $R_{PD}$ in a direction along which the pixel concerned gets away the center CP of the light receiving surface $R_{LR}$.

In the solid-state imaging device of the fourth embodiment, the dispositions of the removal regions 1019a formed in the antireflection film 1019 are different from one another among the pixels in the manner as described above. In particular, the light receiving surface $R_{LR}$ is partitioned into a plurality of regions A11, A12, A21 and A22. Thus, the positions of the removal regions 1019a within the respective photodiode regions $R_{PD}$ are different from one another among the regions obtained through the partition. Also, the positions of the removal regions 1019a are set at ones, close to the center CP of the light receiving surface $R_{LR}$, within the respective photodiode regions $R_{PD}$. Therefore, even when in each of the pixels at the ends of the light receiving surface $R_{LR}$, the light radiation region $R_{LT}$ is off from the center CP of the light receiving surface $R_{LR}$, it is possible to prevent the light radiation region $R_{LT}$ from overlapping the removal region 1019a formed in the antireflection film 1019. As a result, it is possible to suppress the reduction in sensitivity due to the reduction in antireflection efficiency in each of the pixels close to the ends of the light receiving surface $R_{LR}$ in the solid-state imaging device.

In the solid-state imaging device of the fourth embodiment, the removal region 1019a is set as being sufficiently small in the position where the light energy intensity in the light radiation region $R_{LT}$ is sufficiently small, and is also set as being of a size enough to supply hydrogen in order to reduce the dark current. Therefore, an area of the removal region 1019a, for example, is in the range of about 5 to about 10% of an area of the photodiode region $R_{PD}$.

In the solid-state imaging device of the fourth embodiment, the silicon nitride film forming the antireflection film is formed over the entire surface except for the removal regions provided within the respective photodiode regions $R_{PD}$. That is to say, there is obtained the effect that the withstand voltage characteristics can be enhanced because the silicon nitride film is left over the entire surface of the light shielding region $R_{SD}$.

Next, a method of manufacturing the solid-state imaging device according to the fourth embodiment of the present invention will now be described with reference to FIGS. 10A to 10D.

Figure 10A:
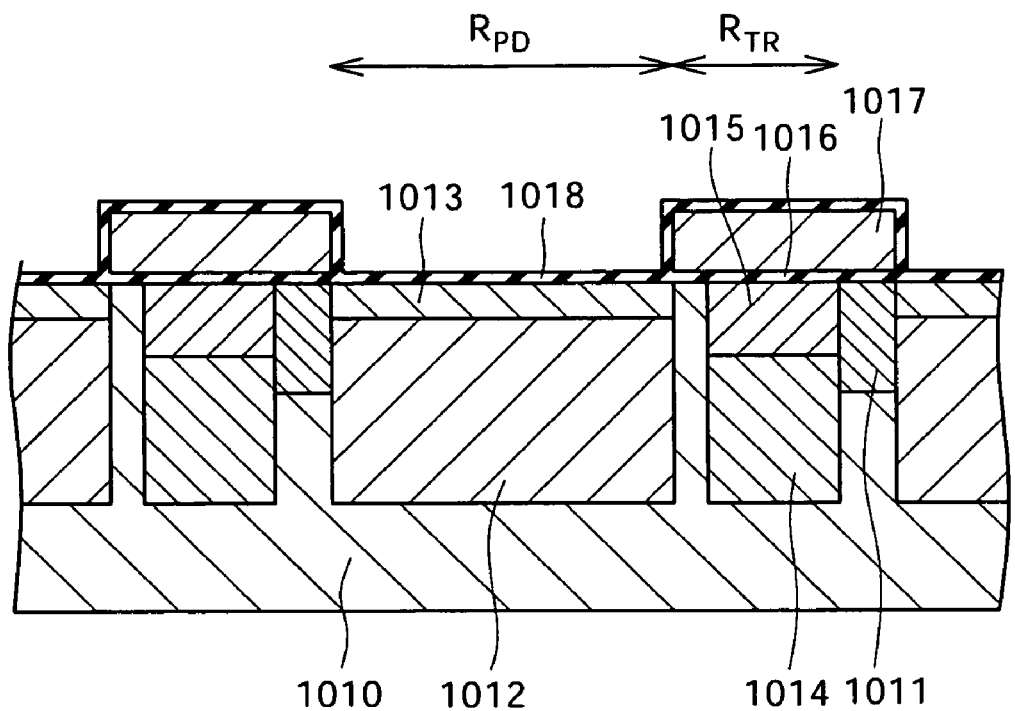
FIGS. 10A to 10D are respectively cross sectional views showing manufacturing processes in a method of manufacturing the solid-state imaging device according to the fourth embodiment of the present invention.

Firstly, as shown in FIG. 10A, for example, the p⁺-type isolation region 1011 through which the light receiving surface $R_{LR}$ is partitioned into a plurality of regions corresponding to the pixels, respectively, is formed in a p-type well region 1010 of a semiconductor substrate.

Next, for example, the n-type charge accumulating layer 1012, and the p⁺-type surface layer 1013 overlying the n-type charge accumulating layer 1012 are formed in each of the photodiode regions $R_{PD}$ of the respective pixels, thereby forming the photodiode having the pn junction. In addition, in the transfer path region $R_{TR}$ adjacent to the photodiode, the p-type semiconductor region 1014 and the n-type semiconductor region 1015 are formed in the p-type well region 1010 of the semiconductor substrate, thereby forming the CCD vertical transfer path.

Next, a silicon oxide film is formed on the substrate by, for example, utilizing a chemical vapor deposition (CVD) method, a thermal oxidation method or the like. A conductive layer made of polysilicon or the like is deposited on the silicon oxide film by utilizing the CVD method or the like, and is then processed into the transfer gate electrode having a predetermined pattern by utilizing a photolithography process, thereby forming the gate insulating film 1016 and the transfer gate electrode 1017 in the region of the CCD vertical transfer path.

Next, a silicon oxide film is deposited so as to cover the entire surface including the surface of the transfer gate electrode 1017 in the photodiode region $R_{PD}$, and the CCD vertical transfer path $R_{TR}$ by, for example, utilizing the CVD method, thereby forming the surface protective film 1018.

Figure 10B:
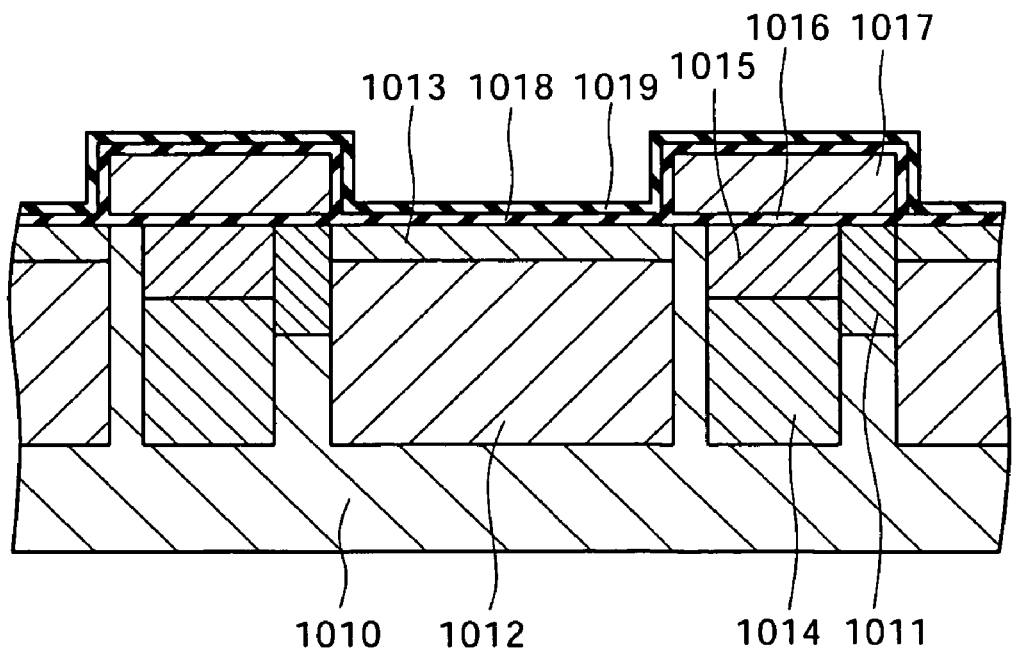

Next, as shown in FIG. 10B, a silicon nitride is deposited over the entire surface of the surface protective film 1018 in the photodiode region $R_{PD}$, and the CCD vertical transfer path $R_{TR}$ by, for example, utilizing the CVD method, thereby forming the antireflection film 1019.

Figure 10C:
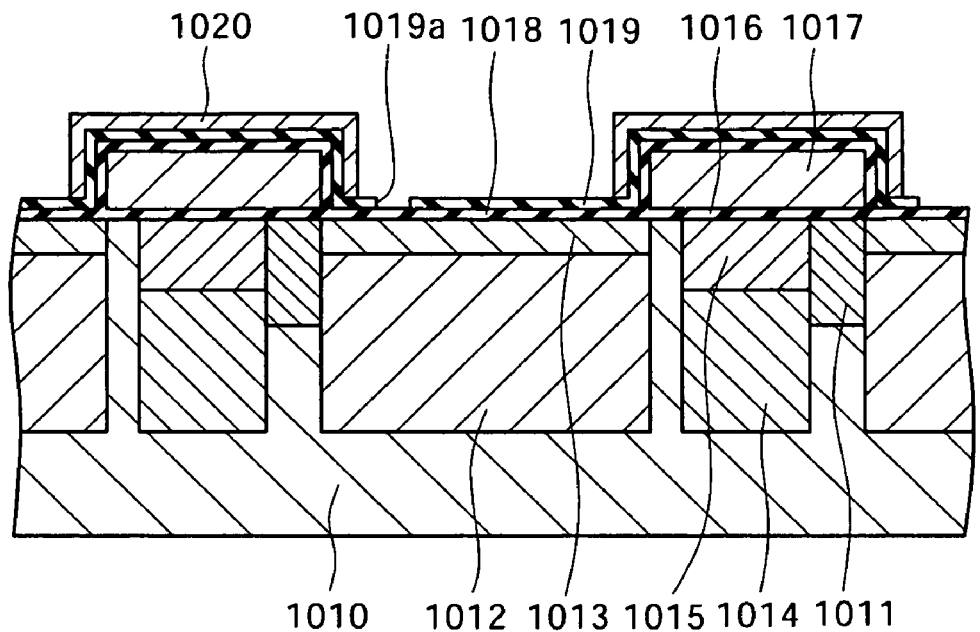

Next, as shown in FIG. 10C, a metal such as aluminum is deposited over the entire surface of the substrate by, for example, utilizing a sputtering method, and a portion of the metal deposited on the entire surface of the substrate in the photodiode region $R_{PD}$ by utilizing the photolithography process, thereby forming the light shielding film 1020.

Next, the removal region 1019a is formed in a portion of the antireflection film 1019 corresponding to a predetermined position within the photodiode region $R_{PD}$ by, for example, a suitable etching method after completion of the photolithography process.

The positions of the removal regions 1019a are determined depending on the dispositions of the pixels within the light receiving surface $R_{LR}$. For example, the light receiving surface $R_{LR}$ is partitioned into a plurality of regions A11, A12, A21 and A22, and the positions of the removal regions 1019a are made different from one another among the regions A11, A12, A21 and A22. For example, the positions of the removal regions 1019a are set as ones, close to the center CP of the light receiving surface $R_{LR}$, within the respective photodiode region $R_{PD}$.

Figure 10D:
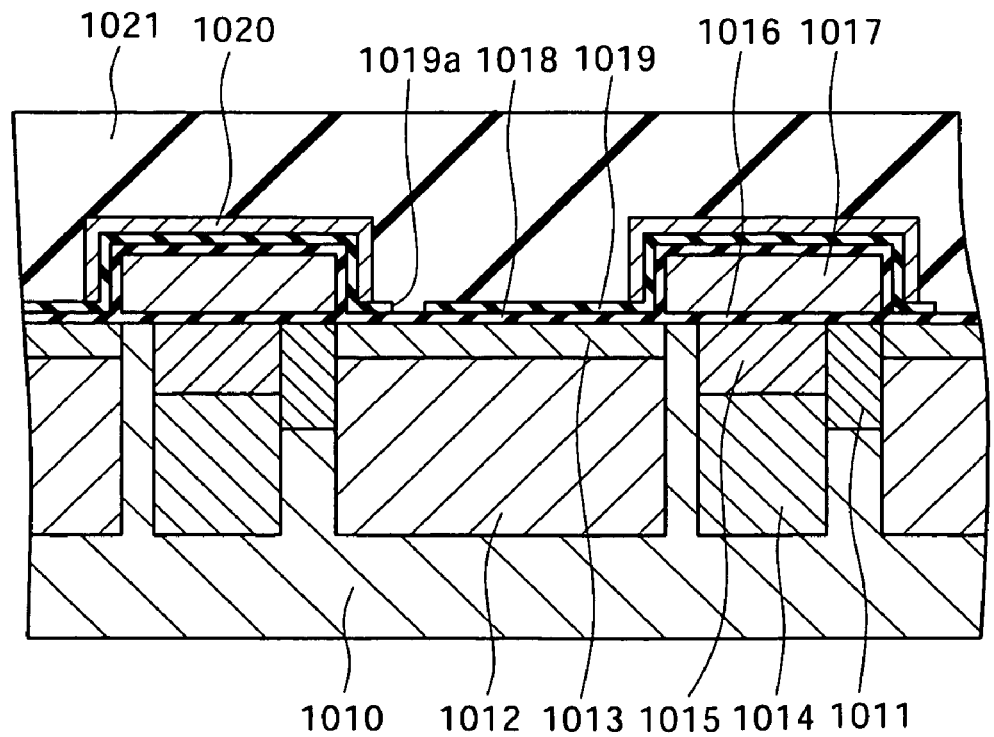

Next, as shown in FIG. 10D, a silicon oxide such as a boro-phospho-silicate glass (BPSG) is deposited over the entire surface of the substrate by utilizing the CVD method or the like. Then, flattening process such as chemical mechanical polishing (CMP) is performed for the silicon oxide thus deposited, thereby forming the flattened insulating film 1021.

For example, after completion of the above flattening process, the hydrotreating (sintering) using hydrogen or a mixed gas of hydrogen and nitrogen is carried out, thereby hydrogen-terminating the dangling-bond in the silicon interface. The hydrotreating may also be carried out either in an earlier stage or in a later stage.

Next, for example, the color filters 1022a, 1022b and 1022c having the three primary colors of red (R), green (G) and blue (B) are partitively formed every pixel on the upper surface of the flattened insulating film 1021. Moreover, the microlens 1023 is formed every pixel so as to overlie the color filters 1022a, 1022b and 1022c, thereby making it possible to manufacture the solid-state imaging device shown in FIGS. 7 and 8 according to the fourth embodiment of the present invention.

Figure 11:
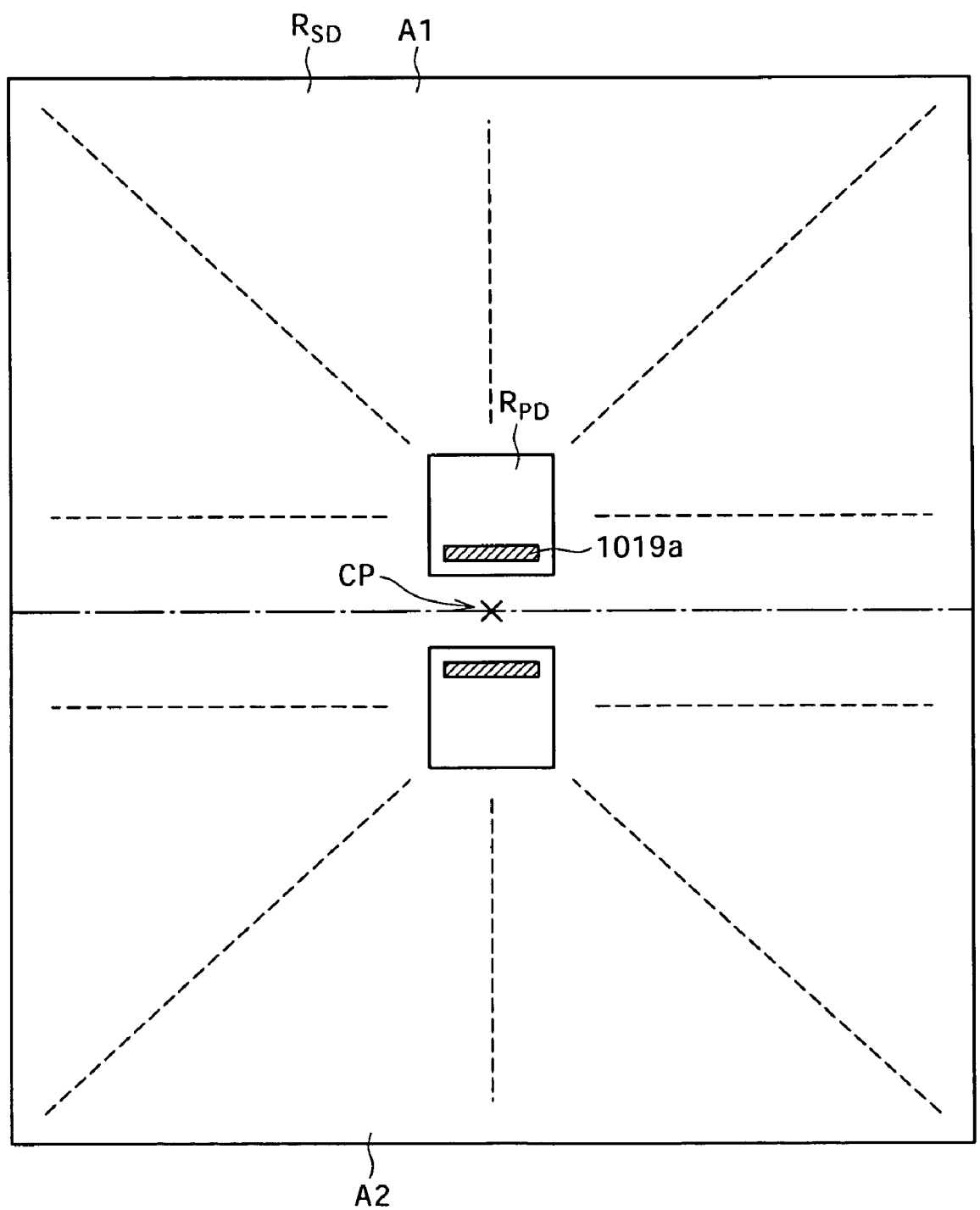
FIG. 11 is a schematic plan view of a light receiving surface of a solid-state imaging device according to a fifth embodiment of the present invention.

According to the method of manufacturing the solid-state imaging device of the fourth embodiment, the light receiving surface is partitioned into a plurality of regions, and the removal regions are formed in the antireflection film so as to be off in the direction, for example, opposite to the direction along which the light radiation regions within the respective photodiode regions get away when viewed from the center of the light receiving surface to the end thereof in the respective regions. As a result, the light radiation region can be prevented from overlapping the removal region in the region from the center to the end of the light receiving surface in each of the regions. Consequently, it is possible to manufacture the solid-state imaging device which is capable of suppressing the reduction in sensitivity due to the reduction in antireflection efficiency in the pixels close to the ends of the light receiving surface in the solid-state imaging device Fifth Embodiment FIG. 11 is a schematic plan view of a light receiving surface of a solid-state imaging device according to a fifth embodiment of the present invention.

In the fifth embodiment, the light receiving surface $R_{LR}$ is partitioned into two regions A1 and A2. Also, the positions of the removal regions 1019a within the respective photodiode regions $R_{PD}$ are different from each other between the regions A1 and A2 obtained through the partition.

For example, the positions of the removal regions 1019a within the respective photodiode region $R_{PD}$ are set as ones, close to the center CP of the light receiving surface $R_{LR}$, within the respective photodiode regions $R_{PD}$. More specifically, in the case of the photodiode located within the upper region A1 when viewed from the center CP on the light receiving surface $R_{LR}$ on the figure, the removal region 1019a is formed in a lower position as the position close to the center CP of the light receiving surface $R_{LR}$ within the photodiode region $R_{PD}$. On the other hand, in the case of the photodiode located within the lower region A2 when viewed from the center CP on the light receiving surface $R_{LR}$ on the figure, the removal region 1019a is formed in an upper position as the position close to the center CP of the light receiving surface $R_{LR}$ within the photodiode region $R_{PD}$.

Figure 12:
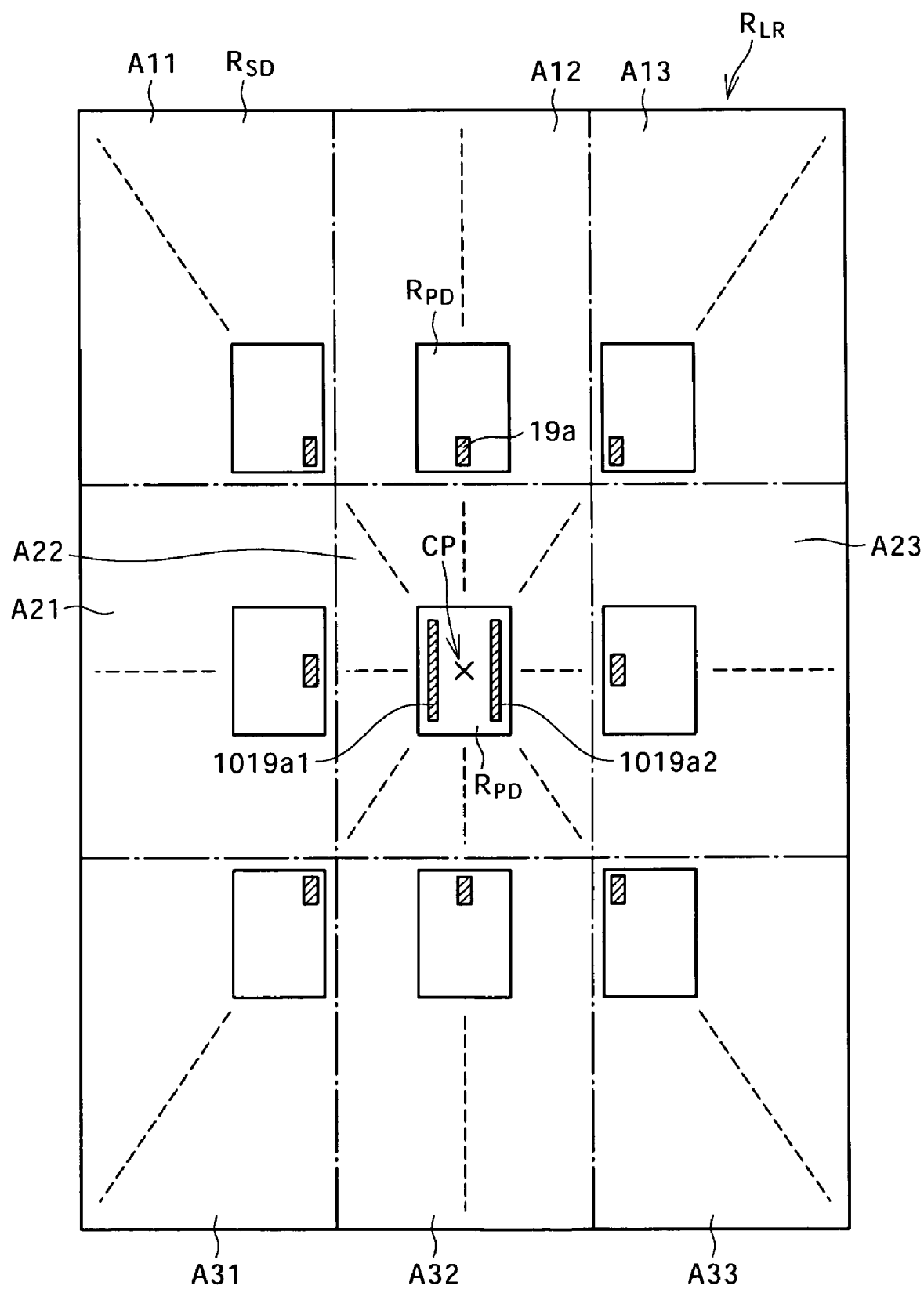
FIG. 12 is a schematic plan view of a light receiving surface of a solid-state imaging device according to a fifth embodiment of the present invention.

FIG. 12 is a schematic plan view of the light receiving surface of the solid-state imaging device according to the fifth embodiment of the present invention.

The dispositions of the removal region 1019a within the respective photodiode regions $R_{PD}$ are different from one another among the pixels. For example, the light receiving surface $R_{LR}$ is partitioned into 9 (=3×3) regions. Also, the positions of the removal regions 1019a within the respective photodiode regions $R_{PD}$ are different from one another among the regions A11, A12, A13, A21, A22, A23, A31, A32 and A33 obtained through the partition.

For example, the positions of the removal regions 1019a within the respective photodiode region $R_{PD}$ are set as ones, close to the center CP of the light receiving surface $R_{LR}$, within the respective photodiode regions $R_{PD}$. More specifically, in the case of the photodiode within the top left-hand region A11 when viewed from the center CP of the light receiving surface $R_{LR}$ on the figure, the removal region 1019a is formed on a bottom right-hand portion as a position, close to the center CP of the light receiving surface $R_{LR}$, within the photodiode region $R_{PD}$.

Similarly to the above case, in the case of the photodiode within the top center region A12 when viewed from the center CP of the light receiving surface $R_{LR}$ on the figure, the removal region 1019a is formed in a bottom center portion as a position, close to the center CP of the light receiving surface $R_{LR}$, within the photodiode region $R_{PD}$. In the case of the photodiode within the top right-hand region A13 when viewed from the center CP of the light receiving surface $R_{LR}$ on the figure, the removal region 1019a is formed in a bottom left-hand portion as a position, close to the center CP of the light receiving surface $R_{LR}$, within the photodiode region $R_{PD}$. Also, in the case of each of the regions A21, A23, A31, A32 and A33, similarly to the above cases, the removal region 1019a is disposed in a position, close to the center CP of the light receiving surface $R_{LR}$, within the photodiode region $R_{PD}$.

On the other hand, in the case of such an area A22 as to contain therein the center CP of the light receiving surface $R_{LR}$, the light radiation region $R_{LT}$ within the photodiode region $R_{PD}$ is located at the center CP of the photodiode region $R_{PD}$. As a result, as with the related art example, the removal regions 1019a1 and 1019a2 can be symmetrically disposed in two parts, respectively, into which the photodiode region $R_{PD}$ is divided.

Or, such a region A22 as to contain the center CP of the light receiving surface $R_{LR}$ is further partitioned into a plurality of regions with respect to such a boundary as to contain therein the center CP of the light receiving surface $R_{LR}$. Thus, the removal regions 1019a may be provided in the positions, close to the center CP of the light receiving surface $R_{LR}$, in the respective regions thus obtained within the photodiode region $R_{PD}$.

In the solid-state imaging device of the fifth embodiment, as has been described above, the dispositions of the removal regions 1019a formed in the antireflection film 1019 are different from one another among the pixels. In particular, the light receiving surface $R_{LR}$ is partitioned into a plurality of regions, and the removal regions 1019a within the respective photodiode regions $R_{PD}$ are different from one another among the regions obtained through the partition. Also, the positions of the removal regions 1019a are set as ones, close to the center CP of the light receiving surface $R_{LR}$, within the respective photodiode regions $R_{PD}$. As a result, even when in each of the pixels at the ends of the light receiving surface $R_{LR}$, the light radiation region $R_{LT}$ gets away from the center CP of the light receiving surface $R_{LR}$, the light radiation region $R_{LT}$ can be prevented from overlapping the removal region 1019a in each of the pixels at the ends of the light receiving surface $R_{LR}$. Consequently, it is possible to suppress the reduction in sensitivity due to the reduction in antireflection efficiency in each of the pixels close to the ends of the light receiving surface $R_{LR}$ in the solid-state imaging device.

Sixth Embodiment

Figure 13:
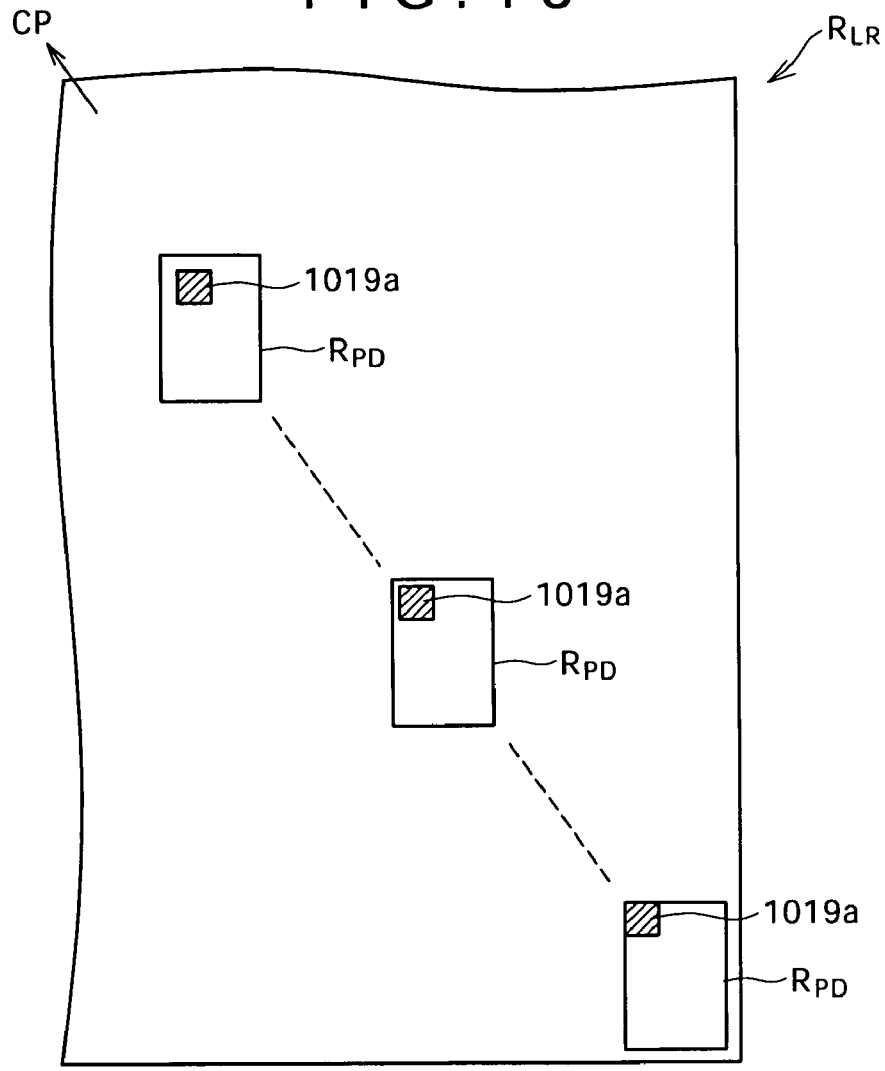
FIG. 13 is a schematic plan view of a part of a light receiving surface of a solid-state imaging device according to a sixth embodiment of the present invention.

FIG. 13 is a schematic plan view of a part of a light receiving surface of a solid-state imaging device according to a sixth embodiment of the present invention.

In the sixth embodiment, the position of the removal region 1019a within the photodiode region $R_{PD}$ is set as one closer to the center CP of the light receiving surface $R_{LR}$ within the photodiode region $R_{PD}$ at the photodiode in the pixel farther from the center CP of the light receiving surface $R_{LR}$.

Adoption of the pattern in which the removal regions 1019a gradually get away the center CP of the light receiving surface $R_{LR}$ among the pixels results in that even when in each of the pixels at the ends of the light receiving surface $R_{LR}$, the light radiation region $R_{LT}$ is off from the center CP of the photodiode region $R_{PD}$, the light radiation region $R_{LT}$ can be effectively prevented from overlapping the removal region 1019a.

Seventh Embodiment

Figure 14:
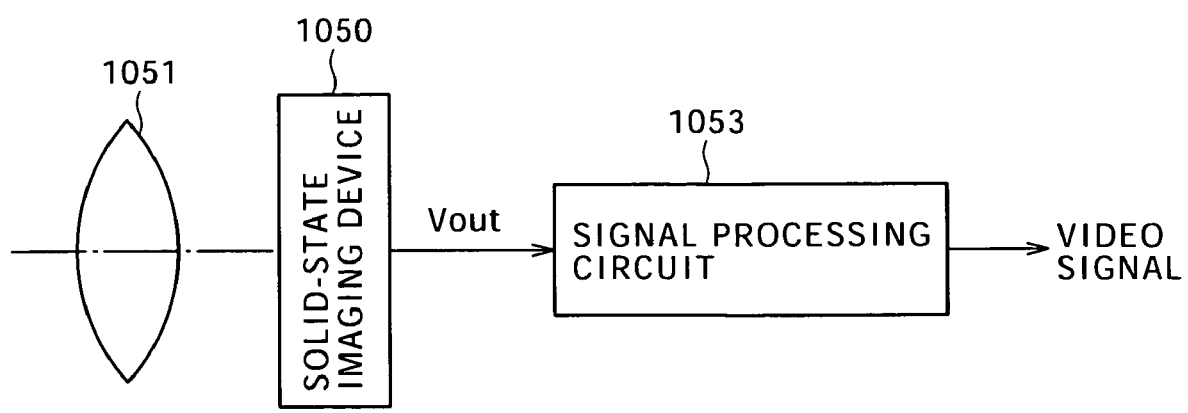
FIG. 14 is a schematic block diagram of a camera apparatus according to a seventh embodiment of the present invention.
Figure 15:
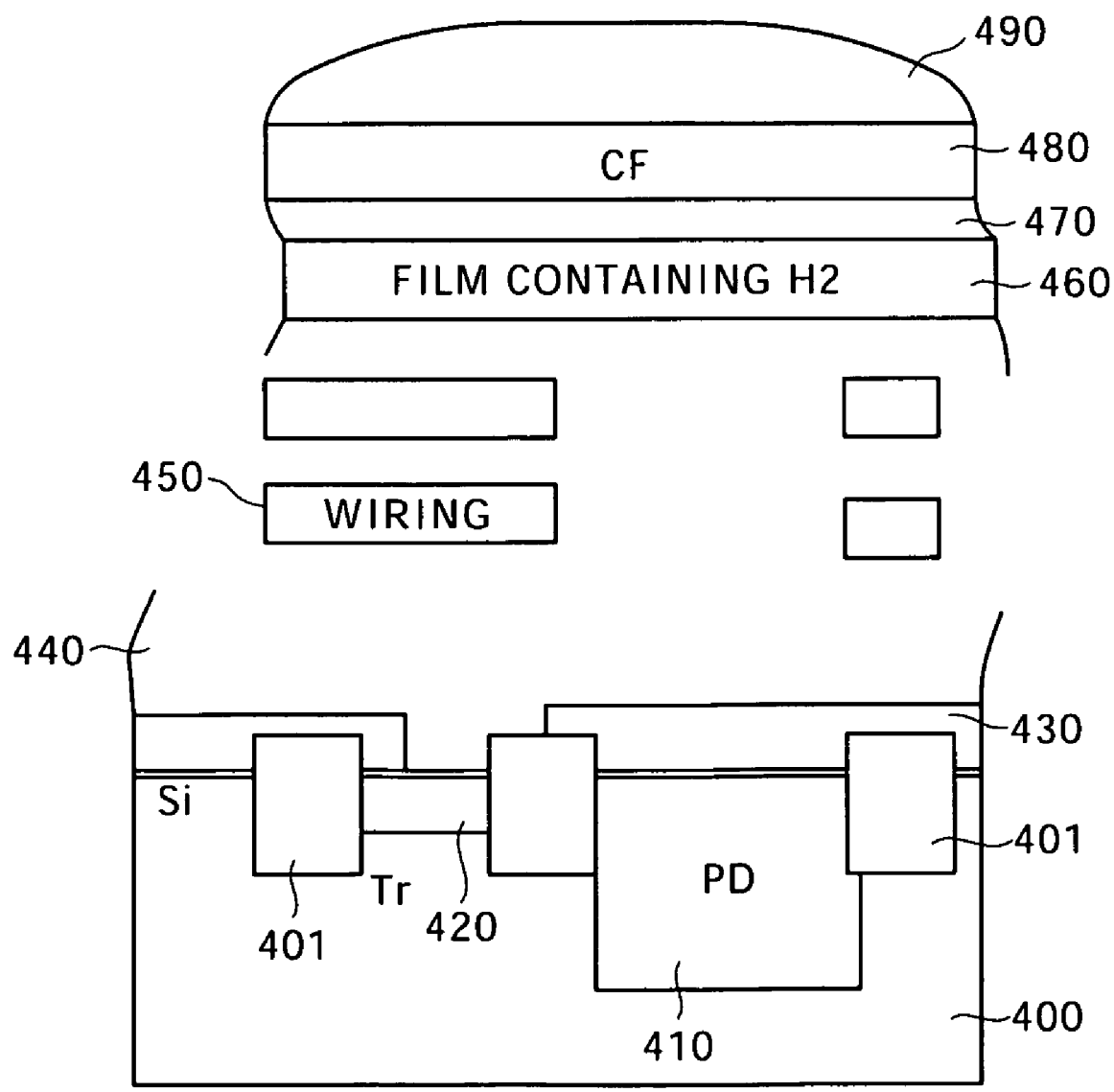
FIG. 15 is a schematic cross sectional view showing a pixel structure of a CMOS image sensor according to a related art example.
Figure 16:
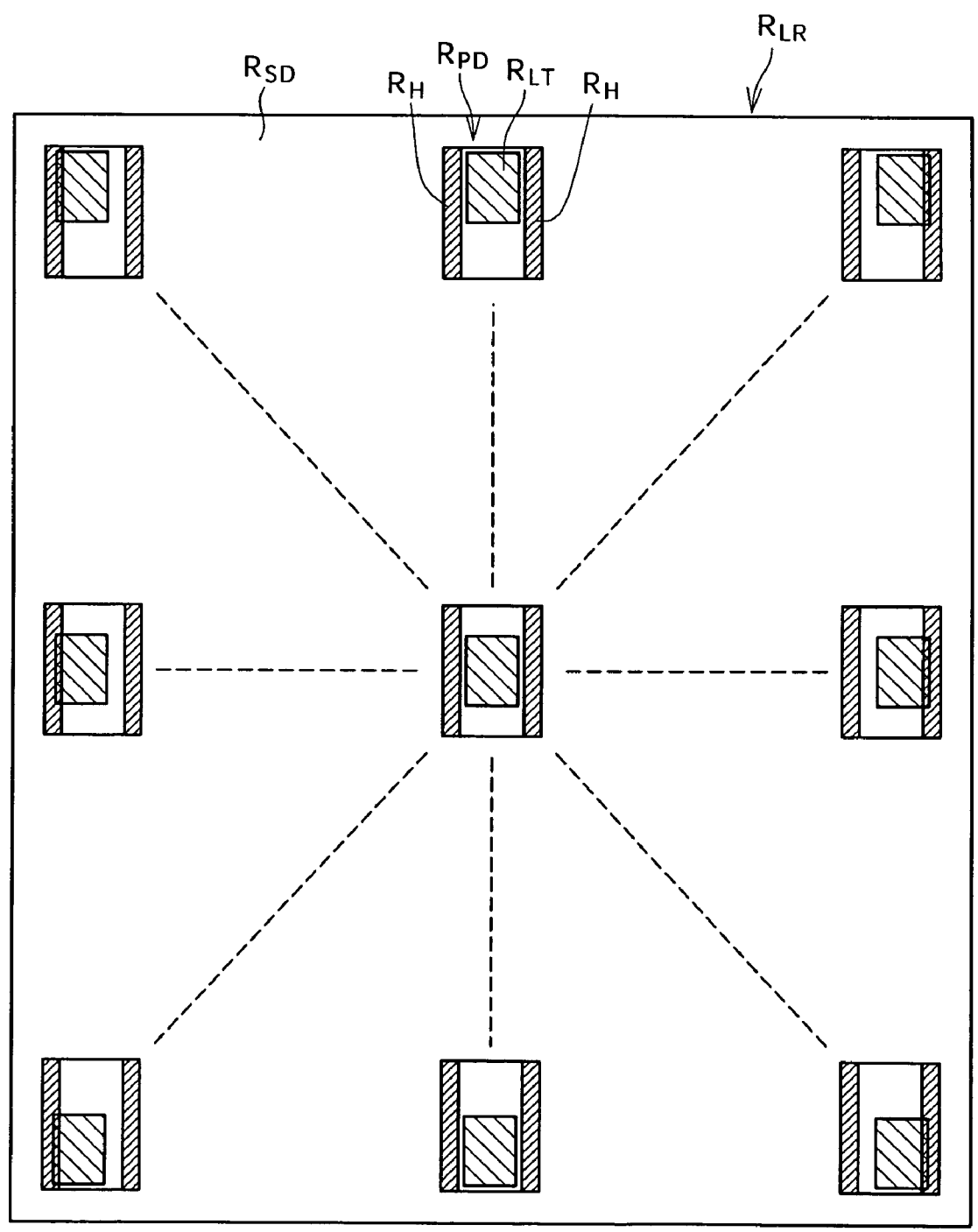
FIG. 16 is a schematic plan view of a light receiving surface of a solid-state imaging device according to the related art example.

FIG. 14 is a schematic block diagram showing a structure of a camera according to a seventh embodiment of the present invention.

In the figure, reference numeral 1050 designates a solid-state imaging device; reference numeral 1051 designates an optical system, and reference numeral 1053 designates a signal processing circuit.

The camera of the seventh embodiment includes the solid-state imaging device 1050 having a plurality of pixels integrated therein, the optical system 1051, and the signal processing circuit 1053.

In this embodiment, the solid-state imaging device according to any one of the first to sixth embodiments described above is used as the above solid-state imaging device 1050.

The optical system 1051 images an image light (incident light) from a subject on an imaging surface of the solid-state imaging device 1050. As a result, each of the photodiodes constituting the respective pixels on the imaging surface of the solid-state imaging device 1050 converts the imaging light made incident thereto into signal charges in correspondence to a quantity of incident light, and accumulates therein the resulting signal charges for a given period of time.

The signal charges thus accumulated are taken out in the form of an output signal $V_{out}$, for example, through a CCD charge transfer path.

The signal processing circuit 1053 executes the various signal processing for the output signal $V_{out}$ sent from the solid-state imaging device 1050, and outputs the resulting signal in the form of a video signal.

According to the camera of this embodiment, color shading characteristics and spectroscopic characteristics can be improved without causing the reduction in efficiency of condensing an oblique incident light, and the reduction in sensitivity. Moreover, the microlens can be formed by utilizing a simple method and simple processes.

It should be noted that the present invention is not intended to be limited to the embodiments described above.

For example, even when the CCD solid-state imaging device is described in each of the embodiments described above, the present invention is not limited thereto, and thus can be applied to any other suitable solid-state imaging device such as the CMOS sensor. In this case, a constituent element for reading out the charges is structured in the form of the CMOS transistor or the like.

It is noted that although in each of the embodiments described above, the removal region is shown as the rectangular region, the present invention is not limited thereto, and thus the removal region may have a circular shape or any other suitable shape. In particular, the shape of the removal region is broken to become a round shape as the miniaturization of the pixel progresses.

In addition, the hydrotreating (sintering), using hydrogen or the mixed gas of hydrogen and nitrogen, for hydrogen-terminating the dangling-bond in the silicon interface is carried out after formation of the flattened insulating film as described above. In addition thereto, the hydrotreating can also be carried out at any other suitable timing. Thus, the hydrotreating may be carried out at any timing after completion of the process for forming the antireflection film made of a silicon nitride, or may be carried out either in the earlier stage or in the later stage. However, in the case of a process including a reflow process, the hydrotreating is preferably carried out after completion of this process.

Moreover, the various changes can be made without departing from the gist of the present invention.

The solid-state imaging device according to the embodiments of the present invention can be applied to the solid-state imaging device mounted either to the CCD camera or to the CMOS camera.

The camera according to the embodiment of the present invention can be applied to the camera to which the solid-state imaging device such as the CCD camera or the CMOS camera is mounted.

It should be understood by those skilled in the art that various modifications, combinations, sub-combinations and alterations may occur depending on design requirements and other factors insofar as they are within the scope of the appended claims or the equivalents thereof.

What is claimed is:

1. A solid-state imaging device having a plurality of pixels integrated on a light receiving surface, said solid-state imaging device comprising:
    a photodiode formed every pixel through partition on a semiconductor substrate becoming said light receiving surface;
    a signal reading-out portion formed on said semiconductor substrate for reading out either signal charges generated and accumulated in said photodiode or a voltage corresponding to the signal charges; and
    an antireflection film formed so as to cover regions of the photodiodes;
    wherein a removal portion obtained by partially removing said antireflection film is provided within each of the photodiode regions, and dispositions of the removal regions within the respective photodiode regions are different from one another among the pixels.

2. The solid-state imaging device according to claim 1, wherein said light receiving surface is partitioned into a plurality of regions, and positions of the removal regions in the respective photodiode regions are different from one another among the pixels.

3. The solid-state imaging device according to claim 1, wherein the positions of the removal regions in the respective photodiode regions are set as ones, close to a center of said light receiving surface, in the respective photodiode regions.

4. The solid-state imaging device according to claim 1, wherein the positions of the removal regions in the respective photodiode regions are set as ones, closer to a center of said light receiving surface, at the photodiodes of the pixels farther from the center of said light receiving surface.

5. The solid-state imaging device according to claim 1, wherein said antireflection film contains therein a silicon nitride.

6. An imaging apparatus, comprising:
    a solid-state imaging device having a plurality of pixels integrated on a light receiving surface;
    an optical system for guiding an incident light to an imaging portion of said solid-state imaging device; and
    a signal processing circuit for processing an output signal from said solid-state imaging device;
    wherein said solid-state imaging device includes
    a photodiode formed every pixel through partition on a semiconductor substrate becoming said light receiving surface,
    a signal reading-out portion formed on said semiconductor substrate for reading out either signal charges generated and accumulated in said photodiode or a voltage corresponding to the signal charges, and
    an antireflection film formed so as to cover regions of the photodiodes, and
    a removal portion obtained by partially removing said antireflection film is provided within each of the photodiode regions, and dispositions of the removal regions within the respective photodiode regions are different from one another among the pixels.

\* \* \* \* \*